United States Patent
Lee et al.

(10) Patent No.: US 9,388,488 B2
(45) Date of Patent: Jul. 12, 2016

(54) ORGANIC FILM DEPOSITION APPARATUS AND METHOD OF MANUFACTURING ORGANIC LIGHT-EMITTING DISPLAY DEVICE BY USING THE SAME

(75) Inventors: Yun-Mi Lee, Yongin (KR); Hyun-Sook Park, Yongin (KR); Jong-Heon Kim, Yongin (KR); Seok-Rak Chang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 98 days.

(21) Appl. No.: 13/015,357

(22) Filed: Jan. 27, 2011

(65) Prior Publication Data
US 2012/0100282 A1 Apr. 26, 2012

(30) Foreign Application Priority Data
Oct. 22, 2010 (KR) .................. 10-2010-0103678

(51) Int. Cl.
| | |
|---|---|
| *B05D 1/32* | (2006.01) |
| *B05D 5/06* | (2006.01) |
| *C23C 14/24* | (2006.01) |
| *C23C 14/04* | (2006.01) |

(Continued)

(52) U.S. Cl.
CPC ............. *C23C 14/243* (2013.01); *C23C 14/042* (2013.01); *C23C 14/12* (2013.01); *B05D 5/06* (2013.01); *H01L 51/0011* (2013.01); *H01L 51/56* (2013.01)

(58) Field of Classification Search
CPC .................. H01L 51/56; H05B 33/10
See application file for complete search history.

(56) References Cited

U.S. PATENT DOCUMENTS

| | | | |
|---|---|---|---|
| 4,416,217 | A | 11/1983 | Nakamura et al. |
| 4,468,648 | A | 8/1984 | Uchikune |

(Continued)

FOREIGN PATENT DOCUMENTS

| | | |
|---|---|---|
| CN | 1476279 A | 2/2004 |
| CN | 1489419 A | 4/2004 |

(Continued)

OTHER PUBLICATIONS

KIPO Office action dated Feb. 6, 2012, for Korean Patent application 10-2010-0014274, 9 pages.

(Continued)

*Primary Examiner* — Michael Cleveland
*Assistant Examiner* — Francisco Tschen
(74) *Attorney, Agent, or Firm* — Lewis Roca Rothgerber Christie LLP

(57) ABSTRACT

An organic film deposition apparatus includes: a deposition source that discharges a deposition material; a deposition source nozzle unit located at a side of the deposition source and including a plurality of deposition source nozzles arranged in a first direction; a patterning slit sheet spaced apart from the deposition source nozzle unit and having a plurality of patterning slits arranged in a second direction perpendicular to the first direction; a first blocking member between the substrate and the deposition source and movable together with the substrate to be positioned to screen at least a part of the substrate; and a second blocking member between the first blocking member and the substrate and fixedly held relative to the deposition source, wherein the substrate is spaced apart from the organic film deposition apparatus and at least one of the substrate or the organic film deposition apparatus moves relative to the other.

3 Claims, 12 Drawing Sheets

(51) Int. Cl.
    *C23C 14/12* (2006.01)
    *H01L 51/00* (2006.01)
    *H01L 51/56* (2006.01)

(56) References Cited

U.S. PATENT DOCUMENTS

| | | |
|---|---|---|
| 4,687,939 A | 8/1987 | Miyauchi et al. |
| 4,792,378 A | 12/1988 | Rose et al. |
| 4,901,667 A | 2/1990 | Suzuki et al. |
| 5,454,847 A | 10/1995 | Jacoboni et al. |
| 5,460,654 A | 10/1995 | Kikkawa et al. |
| 5,487,609 A | 1/1996 | Asada |
| 5,742,129 A | 4/1998 | Nagayama et al. |
| 5,909,995 A | 6/1999 | Wolf et al. |
| 6,091,195 A | 7/2000 | Forrest et al. |
| 6,099,649 A | 8/2000 | Schmitt et al. |
| 6,222,198 B1 | 4/2001 | Brown |
| 6,274,198 B1 | 8/2001 | Dautartas |
| 6,280,821 B1 | 8/2001 | Kadunce et al. |
| 6,371,451 B1 | 4/2002 | Choi |
| 6,417,034 B2 | 7/2002 | Kitazume et al. |
| 6,443,597 B1 | 9/2002 | Natori |
| 6,483,690 B1 | 11/2002 | Nakajima et al. |
| 6,541,130 B2 | 4/2003 | Fukuda |
| 6,554,969 B1 | 4/2003 | Chong |
| 6,579,422 B1 | 6/2003 | Kakinuma |
| 6,589,673 B1 | 7/2003 | Kido et al. |
| 6,650,023 B2 | 11/2003 | Kim |
| 6,699,324 B1 | 3/2004 | Berdin et al. |
| 6,749,906 B2 | 6/2004 | Van Slyke |
| 6,776,847 B2 | 8/2004 | Yamazaki et al. |
| 6,837,939 B1 | 1/2005 | Klug et al. |
| 6,878,209 B2 | 4/2005 | Himeshima et al. |
| 6,946,783 B2 | 9/2005 | Kim |
| 6,995,035 B2 | 2/2006 | Cok et al. |
| 7,006,202 B2 | 2/2006 | Byun et al. |
| RE39,024 E | 3/2006 | Takahashi |
| 7,078,070 B2 | 7/2006 | Peng |
| 7,199,520 B2 | 4/2007 | Fujii et al. |
| 7,322,248 B1 | 1/2008 | Long et al. |
| 7,495,389 B2 | 2/2009 | Noguchi et al. |
| 7,601,439 B2 | 10/2009 | Chun et al. |
| 7,776,457 B2 | 8/2010 | Lee et al. |
| 7,872,256 B2 | 1/2011 | Sung et al. |
| 7,910,386 B2 | 3/2011 | Shiang et al. |
| 7,964,037 B2 | 6/2011 | Fukuda et al. |
| 8,022,448 B1 | 9/2011 | Luu et al. |
| 8,128,753 B2 | 3/2012 | Bulovic et al. |
| 8,137,466 B2 | 3/2012 | Kang et al. |
| 8,188,476 B2 | 5/2012 | Takagi et al. |
| 8,193,011 B2 | 6/2012 | Kang et al. |
| 8,673,077 B2 | 3/2014 | Sonoda et al. |
| 2001/0004186 A1 | 6/2001 | Song et al. |
| 2001/0006827 A1 | 7/2001 | Yamazaki et al. |
| 2001/0019807 A1* | 9/2001 | Yamada et al. ............... 430/139 |
| 2001/0026638 A1 | 10/2001 | Sangu et al. |
| 2001/0034175 A1 | 10/2001 | Miyazaki et al. |
| 2002/0011785 A1 | 1/2002 | Tang et al. |
| 2002/0017245 A1 | 2/2002 | Tsubaki et al. |
| 2002/0033136 A1 | 3/2002 | Savage et al. |
| 2002/0076847 A1 | 6/2002 | Yamada et al. |
| 2002/0168577 A1 | 11/2002 | Yoon |
| 2002/0179013 A1 | 12/2002 | Kido et al. |
| 2002/0187253 A1 | 12/2002 | Marcus et al. |
| 2002/0194727 A1 | 12/2002 | Cho et al. |
| 2002/0197393 A1 | 12/2002 | Kuwabara |
| 2003/0044517 A1 | 3/2003 | Nishikawa et al. |
| 2003/0101932 A1 | 6/2003 | Kang |
| 2003/0101937 A1 | 6/2003 | Van Slyke et al. |
| 2003/0117602 A1 | 6/2003 | Kobayashi et al. |
| 2003/0118950 A1 | 6/2003 | Chao et al. |
| 2003/0124764 A1 | 7/2003 | Yamazaki et al. |
| 2003/0150100 A1 | 8/2003 | Takasaki et al. |
| 2003/0151637 A1 | 8/2003 | Nakamura et al. |
| 2003/0164934 A1 | 9/2003 | Nishi et al. |
| 2003/0168013 A1 | 9/2003 | Freeman et al. |
| 2003/0173896 A1 | 9/2003 | Grushin et al. |
| 2003/0221614 A1 | 12/2003 | Kang et al. |
| 2003/0221620 A1 | 12/2003 | Yamazaki |
| 2003/0232563 A1* | 12/2003 | Kamiyama et al. ............. 445/24 |
| 2004/0016907 A1 | 1/2004 | Shi |
| 2004/0028349 A1 | 2/2004 | Nagasaka et al. |
| 2004/0029028 A1 | 2/2004 | Shimizu |
| 2004/0056244 A1* | 3/2004 | Marcus et al. .................. 257/40 |
| 2004/0062856 A1 | 4/2004 | Marcus et al. |
| 2004/0086639 A1 | 5/2004 | Grantham et al. |
| 2004/0096771 A1 | 5/2004 | Kashiwagi et al. |
| 2004/0115338 A1* | 6/2004 | Yoneda ........................... 427/66 |
| 2004/0115342 A1 | 6/2004 | Shigemura |
| 2004/0123804 A1 | 7/2004 | Yamazaki et al. |
| 2004/0127066 A1 | 7/2004 | Jung |
| 2004/0134428 A1 | 7/2004 | Sasaki et al. |
| 2004/0142108 A1 | 7/2004 | Atobe et al. |
| 2004/0144321 A1 | 7/2004 | Grace et al. |
| 2004/0157167 A1 | 8/2004 | Morii |
| 2004/0183435 A1 | 9/2004 | Ohshita |
| 2004/0194702 A1 | 10/2004 | Sasaki et al. |
| 2004/0195530 A1 | 10/2004 | Kwak et al. |
| 2004/0216673 A1 | 11/2004 | Sakata et al. |
| 2004/0255857 A1 | 12/2004 | Chow et al. |
| 2004/0263547 A1 | 12/2004 | Sugahara |
| 2004/0263771 A1 | 12/2004 | Jeong et al. |
| 2005/0001546 A1 | 1/2005 | Yamaguchi |
| 2005/0016461 A1* | 1/2005 | Klug et al. .................... 118/726 |
| 2005/0031836 A1 | 2/2005 | Hirai |
| 2005/0037136 A1 | 2/2005 | Yamamoto |
| 2005/0039684 A1 | 2/2005 | Yi et al. |
| 2005/0072359 A1 | 4/2005 | Kim |
| 2005/0072361 A1 | 4/2005 | Yang et al. |
| 2005/0079418 A1 | 4/2005 | Kelley et al. |
| 2005/0110400 A1 | 5/2005 | Nakamura |
| 2005/0118788 A1 | 6/2005 | Kuwahara et al. |
| 2005/0129489 A1 | 6/2005 | Quan et al. |
| 2005/0153472 A1 | 7/2005 | Yotsuya |
| 2005/0166842 A1 | 8/2005 | Sakamoto |
| 2005/0166844 A1 | 8/2005 | Gralenski |
| 2005/0183670 A1 | 8/2005 | Grantham et al. |
| 2005/0186330 A1 | 8/2005 | Kim et al. |
| 2005/0213021 A1 | 9/2005 | Myoung |
| 2005/0217584 A1 | 10/2005 | Abiko et al. |
| 2005/0229848 A1 | 10/2005 | Shinriki et al. |
| 2005/0244580 A1 | 11/2005 | Cok et al. |
| 2005/0263074 A1 | 12/2005 | Masuda et al. |
| 2005/0280356 A1 | 12/2005 | Murayama et al. |
| 2005/0287897 A1 | 12/2005 | Tanaka et al. |
| 2006/0011136 A1 | 1/2006 | Yamazaki et al. |
| 2006/0012280 A1 | 1/2006 | Kang et al. |
| 2006/0012771 A1 | 1/2006 | Jeong |
| 2006/0022590 A1 | 2/2006 | Aziz et al. |
| 2006/0040132 A1 | 2/2006 | Liao et al. |
| 2006/0045958 A1 | 3/2006 | Abiko et al. |
| 2006/0066231 A1 | 3/2006 | Nishikawa et al. |
| 2006/0090705 A1 | 5/2006 | Kim |
| 2006/0102078 A1 | 5/2006 | Fairbairn et al. |
| 2006/0103289 A1 | 5/2006 | Kim et al. |
| 2006/0110544 A1 | 5/2006 | Kim et al. |
| 2006/0113907 A1 | 6/2006 | Im et al. |
| 2006/0115585 A1 | 6/2006 | Bulovic et al. |
| 2006/0130766 A1 | 6/2006 | Kim et al. |
| 2006/0144325 A1 | 7/2006 | Jung et al. |
| 2006/0152641 A1 | 7/2006 | Brody |
| 2006/0164786 A1 | 7/2006 | Kobayashi et al. |
| 2006/0169211 A1 | 8/2006 | Kim et al. |
| 2006/0174829 A1 | 8/2006 | An et al. |
| 2006/0205101 A1 | 9/2006 | Lee et al. |
| 2006/0244696 A1 | 11/2006 | Jung et al. |
| 2006/0267294 A1 | 11/2006 | Busse et al. |
| 2006/0269671 A1 | 11/2006 | Kim et al. |
| 2006/0272572 A1 | 12/2006 | Uematsu et al. |
| 2006/0278522 A1 | 12/2006 | Kim et al. |
| 2006/0278945 A1 | 12/2006 | Sakurai |
| 2006/0280588 A1 | 12/2006 | Blonigen et al. |
| 2007/0009552 A1 | 1/2007 | Whitehead et al. |
| 2007/0009652 A1 | 1/2007 | Manz et al. |

(56) References Cited

U.S. PATENT DOCUMENTS

| | | | |
|---|---|---|---|
| 2007/0017445 A1 | 1/2007 | Takehara et al. |
| 2007/0022955 A1 | 2/2007 | Bender et al. |
| 2007/0024185 A1 | 2/2007 | Kitamura et al. |
| 2007/0046185 A1 | 3/2007 | Kim |
| 2007/0046913 A1 | 3/2007 | Shibazaki |
| 2007/0054044 A1 | 3/2007 | Shimosaki et al. |
| 2007/0075955 A1 | 4/2007 | Jung et al. |
| 2007/0077358 A1 | 4/2007 | Jeong et al. |
| 2007/0137568 A1 | 6/2007 | Schreiber |
| 2007/0148337 A1 | 6/2007 | Nichols et al. |
| 2007/0148348 A1 | 6/2007 | Huh et al. |
| 2007/0157879 A1 | 7/2007 | Yotsuya |
| 2007/0158471 A1 | 7/2007 | Park et al. |
| 2007/0163497 A1 | 7/2007 | Grace et al. |
| 2007/0178708 A1 | 8/2007 | Ukigaya |
| 2007/0195844 A1 | 8/2007 | Ma et al. |
| 2007/0231460 A1 | 10/2007 | Ukigaya |
| 2007/0235157 A1 | 10/2007 | Bunker et al. |
| 2007/0275497 A1 | 11/2007 | Kwack et al. |
| 2007/0297887 A1 | 12/2007 | Tanaka |
| 2008/0018236 A1 | 1/2008 | Arai et al. |
| 2008/0038935 A1 | 2/2008 | Baude et al. |
| 2008/0057183 A1 | 3/2008 | Spindler et al. |
| 2008/0100204 A1 | 5/2008 | Kim |
| 2008/0115729 A1 | 5/2008 | Oda et al. |
| 2008/0118743 A1 | 5/2008 | Lee et al. |
| 2008/0126741 A1 | 5/2008 | Triplett |
| 2008/0129194 A1 | 6/2008 | Abe et al. |
| 2008/0131587 A1 | 6/2008 | Boroson et al. |
| 2008/0145521 A1 | 6/2008 | Guo et al. |
| 2008/0174235 A1 | 7/2008 | Kim et al. |
| 2008/0176414 A1 | 7/2008 | Im |
| 2008/0216741 A1 | 9/2008 | Ling et al. |
| 2008/0238294 A1 | 10/2008 | Xu et al. |
| 2008/0251785 A1 | 10/2008 | Noh et al. |
| 2008/0286461 A1 | 11/2008 | Noguchi et al. |
| 2008/0290791 A1 | 11/2008 | Lee et al. |
| 2008/0298947 A1 | 12/2008 | Yeo et al. |
| 2008/0309718 A1 | 12/2008 | Oya et al. |
| 2009/0001882 A1 | 1/2009 | Park et al. |
| 2009/0014412 A1 | 1/2009 | Nozawa et al. |
| 2009/0017192 A1 | 1/2009 | Matsuura |
| 2009/0027767 A1 | 1/2009 | Souriau et al. |
| 2009/0124033 A1 | 5/2009 | Moriyama |
| 2009/0133629 A1 | 5/2009 | Kamikawa et al. |
| 2009/0153033 A1 | 6/2009 | Lee et al. |
| 2009/0165713 A1 | 7/2009 | Kim et al. |
| 2009/0169868 A1 | 7/2009 | Haglund, Jr. et al. |
| 2009/0181163 A1 | 7/2009 | Uetake |
| 2009/0208754 A1* | 8/2009 | Chu et al. ............... 428/411.1 |
| 2009/0220691 A1 | 9/2009 | Kim |
| 2009/0232976 A1 | 9/2009 | Yoon et al. |
| 2009/0269881 A1 | 10/2009 | Furuta et al. |
| 2009/0277386 A1 | 11/2009 | Takagi et al. |
| 2009/0279173 A1 | 11/2009 | Chui et al. |
| 2009/0302750 A1 | 12/2009 | Jun et al. |
| 2009/0304906 A1 | 12/2009 | Suduo et al. |
| 2009/0304924 A1 | 12/2009 | Gadgil |
| 2009/0308317 A1 | 12/2009 | Sone et al. |
| 2009/0315456 A1 | 12/2009 | Furukawa et al. |
| 2010/0000854 A1 | 1/2010 | Goto et al. |
| 2010/0001301 A1 | 1/2010 | Karg et al. |
| 2010/0055810 A1 | 3/2010 | Sung et al. |
| 2010/0086672 A1 | 4/2010 | Von Drasek et al. |
| 2010/0089443 A1 | 4/2010 | Bloomstein et al. |
| 2010/0090594 A1 | 4/2010 | Choi et al. |
| 2010/0130020 A1 | 5/2010 | Kim et al. |
| 2010/0156279 A1 | 6/2010 | Tamura et al. |
| 2010/0170439 A1 | 7/2010 | Negishi |
| 2010/0192856 A1 | 8/2010 | Sung et al. |
| 2010/0196607 A1 | 8/2010 | Carlson et al. |
| 2010/0248416 A1 | 9/2010 | Priddy et al. |
| 2010/0255198 A1 | 10/2010 | Cleary et al. |
| 2010/0271602 A1 | 10/2010 | Hanazaki |
| 2010/0275842 A1 | 11/2010 | Park et al. |
| 2010/0297348 A1 | 11/2010 | Lee et al. |
| 2010/0297349 A1 | 11/2010 | Lee et al. |
| 2010/0310759 A1 | 12/2010 | Lee et al. |
| 2010/0310768 A1 | 12/2010 | Lee et al. |
| 2010/0316801 A1 | 12/2010 | Lee et al. |
| 2010/0328197 A1 | 12/2010 | Lee et al. |
| 2010/0330265 A1 | 12/2010 | Lee et al. |
| 2010/0330712 A1 | 12/2010 | Lee et al. |
| 2011/0033619 A1 | 2/2011 | Lee et al. |
| 2011/0033621 A1 | 2/2011 | Lee et al. |
| 2011/0042659 A1 | 2/2011 | Kim et al. |
| 2011/0045617 A1 | 2/2011 | Kang et al. |
| 2011/0048320 A1 | 3/2011 | Choi et al. |
| 2011/0052791 A1 | 3/2011 | Jo et al. |
| 2011/0052795 A1 | 3/2011 | Choi et al. |
| 2011/0053296 A1 | 3/2011 | Lee et al. |
| 2011/0053300 A1 | 3/2011 | Ryu et al. |
| 2011/0068331 A1 | 3/2011 | Koh et al. |
| 2011/0123707 A1 | 5/2011 | Lee et al. |
| 2011/0139069 A1 | 6/2011 | Ahn et al. |
| 2011/0165327 A1 | 7/2011 | Park et al. |
| 2011/0168986 A1 | 7/2011 | Lee et al. |
| 2011/0220019 A1 | 9/2011 | Lee et al. |
| 2011/0220022 A1 | 9/2011 | Hong et al. |
| 2011/0241438 A1 | 10/2011 | Kim et al. |
| 2011/0262625 A1 | 10/2011 | Park et al. |
| 2011/0266944 A1 | 11/2011 | Song et al. |
| 2012/0006259 A1 | 1/2012 | Sung et al. |
| 2012/0009328 A1 | 1/2012 | Ryu et al. |
| 2012/0009332 A1 | 1/2012 | Kim et al. |
| 2012/0009706 A1 | 1/2012 | Choi et al. |
| 2012/0028390 A1 | 2/2012 | Lee et al. |
| 2012/0068199 A1 | 3/2012 | Sung et al. |
| 2012/0068201 A1 | 3/2012 | Sung et al. |
| 2012/0070928 A1 | 3/2012 | Kim et al. |
| 2012/0083061 A1 | 4/2012 | Kang et al. |
| 2012/0097992 A1 | 4/2012 | Jeong |
| 2012/0103253 A1 | 5/2012 | Park et al. |
| 2012/0132137 A1 | 5/2012 | Oh et al. |
| 2012/0145077 A1 | 6/2012 | Chang et al. |
| 2012/0148743 A1 | 6/2012 | Bulovic et al. |
| 2012/0174865 A1 | 7/2012 | Choi et al. |
| 2012/0175605 A1 | 7/2012 | Shin et al. |
| 2012/0183676 A1 | 7/2012 | Sonoda et al. |
| 2012/0214263 A1 | 8/2012 | Yamazaki et al. |
| 2012/0299016 A1 | 11/2012 | Choi |
| 2012/0299023 A1 | 11/2012 | Lee et al. |
| 2012/0299024 A1 | 11/2012 | Lee et al. |
| 2012/0301614 A1 | 11/2012 | Choi et al. |
| 2012/0301986 A1 | 11/2012 | Choi et al. |
| 2012/0313251 A1 | 12/2012 | Kato |
| 2013/0001528 A1 | 1/2013 | Chang et al. |
| 2013/0008379 A1 | 1/2013 | Chang et al. |
| 2013/0032829 A1 | 2/2013 | Sung et al. |
| 2013/0157016 A1 | 6/2013 | Kim |
| 2013/0217164 A1 | 8/2013 | Kang et al. |
| 2013/0291796 A1 | 11/2013 | Inoue et al. |
| 2013/0298829 A1 | 11/2013 | Jo et al. |
| 2013/0341598 A1 | 12/2013 | Chang et al. |
| 2014/0010957 A1 | 1/2014 | Inoue et al. |
| 2014/0014917 A1 | 1/2014 | Lee et al. |
| 2014/0014918 A1 | 1/2014 | Han |
| 2014/0014920 A1 | 1/2014 | Lee |
| 2014/0014921 A1 | 1/2014 | Choi |
| 2014/0014924 A1 | 1/2014 | Oh et al. |
| 2014/0014929 A1 | 1/2014 | Lee et al. |
| 2014/0034917 A1 | 2/2014 | Lee et al. |
| 2014/0045343 A1 | 2/2014 | Choi et al. |
| 2014/0077168 A1 | 3/2014 | Kim |
| 2014/0084262 A1 | 3/2014 | Kim |
| 2014/0084263 A1 | 3/2014 | Jin et al. |
| 2014/0110680 A1 | 4/2014 | Choe |
| 2014/0131667 A1 | 5/2014 | Chang |

FOREIGN PATENT DOCUMENTS

| | | |
|---|---|---|
| CN | 1500904 A | 6/2004 |
| CN | 1556872 A | 12/2004 |
| CN | 1607868 A | 4/2005 |

(56) References Cited

FOREIGN PATENT DOCUMENTS

| | | |
|---|---|---|
| CN | 1682569 A | 10/2005 |
| CN | 1704501 A | 12/2005 |
| CN | 1716102 A | 1/2006 |
| CN | 1814854 A | 8/2006 |
| CN | 1841696 A | 10/2006 |
| EP | 1 413 644 A2 | 4/2004 |
| EP | 1 418 250 A2 | 5/2004 |
| EP | 1 518 940 A1 | 3/2005 |
| EP | 2354270 A1 | 8/2011 |
| JP | 57-194252 | 11/1982 |
| JP | 2-247372 | 10/1990 |
| JP | 04-272170 | 9/1992 |
| JP | 5-22405 U1 | 3/1993 |
| JP | 5-98425 A2 | 4/1993 |
| JP | 05-230628 | 9/1993 |
| JP | 8-27568 A2 | 1/1996 |
| JP | 09-095776 | 4/1997 |
| JP | 10-50478 | 2/1998 |
| JP | 10-120171 | 5/1998 |
| JP | 10-270535 | 10/1998 |
| JP | 11-144865 | 5/1999 |
| JP | 2000-068054 | 3/2000 |
| JP | 2000-282219 | 10/2000 |
| JP | 2000-323277 | 11/2000 |
| JP | 2001-28325 A2 | 1/2001 |
| JP | 2001-052862 | 2/2001 |
| JP | 2001-093667 | 4/2001 |
| JP | 2002-75638 A2 | 3/2002 |
| JP | 2002-175878 | 6/2002 |
| JP | 2002-348659 A2 | 12/2002 |
| JP | 2003-003250 | 1/2003 |
| JP | 2003-077662 | 3/2003 |
| JP | 2003-157973 | 5/2003 |
| JP | 2003-197531 A2 | 7/2003 |
| JP | 2003-297562 | 10/2003 |
| JP | 2003-321767 A2 | 11/2003 |
| JP | 2003-347394 A2 | 12/2003 |
| JP | 2004-035964 A2 | 2/2004 |
| JP | 2004-043898 | 2/2004 |
| JP | 2004-76150 A2 | 3/2004 |
| JP | 2004-91858 A2 | 3/2004 |
| JP | 2004-103269 | 4/2004 |
| JP | 2004-103341 | 4/2004 |
| JP | 2004-107764 A2 | 4/2004 |
| JP | 2004-137583 A2 | 5/2004 |
| JP | 2004-143521 A2 | 5/2004 |
| JP | 2004-169169 A2 | 6/2004 |
| JP | 2004-199919 | 7/2004 |
| JP | 2004-225058 | 8/2004 |
| JP | 2004-342455 A2 | 12/2004 |
| JP | 2004-349101 | 12/2004 |
| JP | 2004-355975 | 12/2004 |
| JP | 2005-044592 | 2/2005 |
| JP | 2005-101505 | 4/2005 |
| JP | 2005-122980 A2 | 5/2005 |
| JP | 2005-163099 | 6/2005 |
| JP | 2005-165015 | 6/2005 |
| JP | 2005-174843 A2 | 6/2005 |
| JP | 2005-206939 A2 | 8/2005 |
| JP | 2005-213616 A2 | 8/2005 |
| JP | 2005-235568 | 9/2005 |
| JP | 2005-293968 | 10/2005 |
| JP | 2005-296737 | 10/2005 |
| JP | 2006-28583 A2 | 2/2006 |
| JP | 2006-172930 A2 | 6/2006 |
| JP | 2006-176809 A2 | 7/2006 |
| JP | 2006-210038 A2 | 8/2006 |
| JP | 2006-219760 | 8/2006 |
| JP | 2006-275433 | 10/2006 |
| JP | 2006-292955 A2 | 10/2006 |
| JP | 2006-307247 A2 | 11/2006 |
| JP | 2007-047293 | 2/2007 |
| JP | 2007-66862 | 3/2007 |
| JP | 2007-146219 | 6/2007 |
| JP | 2007-157886 | 6/2007 |
| JP | 2007-186740 A2 | 7/2007 |
| JP | 2007-242436 | 9/2007 |
| JP | 2007-291506 A2 | 11/2007 |
| JP | 2008-19477 A2 | 1/2008 |
| JP | 2008-108628 A2 | 5/2008 |
| JP | 2008-121098 | 5/2008 |
| JP | 2008-521165 A2 | 6/2008 |
| JP | 2008-156686 | 7/2008 |
| JP | 2008-196003 | 8/2008 |
| JP | 2008-248301 A2 | 10/2008 |
| JP | 2008-274373 | 11/2008 |
| JP | 2008-300056 | 12/2008 |
| JP | 2009-019243 | 1/2009 |
| JP | 2009-24208 A2 | 2/2009 |
| JP | 2009-049223 | 3/2009 |
| JP | 2009-81165 A2 | 4/2009 |
| JP | 2009-087910 | 4/2009 |
| JP | 2009-117231 A2 | 5/2009 |
| JP | 2009-520110 | 5/2009 |
| JP | 2010-159167 A2 | 7/2010 |
| JP | 2010-261081 A2 | 11/2010 |
| JP | 2011-47035 | 3/2011 |
| JP | 2011-146377 | 7/2011 |
| JP | 2012-92448 | 5/2012 |
| JP | 2012-211352 | 11/2012 |
| KR | 1997-0008709 A | 2/1997 |
| KR | 10-0257219 B1 | 2/2000 |
| KR | 10-2000-0019254 | 4/2000 |
| KR | 10-2000-0023929 | 5/2000 |
| KR | 2001-0024652 A | 3/2001 |
| KR | 2001-0030175 A | 4/2001 |
| KR | 10-2001-0039298 A | 5/2001 |
| KR | 10-2001-0059939 | 7/2001 |
| KR | 10-2001-0092914 A | 10/2001 |
| KR | 2001-0093666 A | 10/2001 |
| KR | 20-0257218 Y1 | 12/2001 |
| KR | 10-2002-0000201 | 1/2002 |
| KR | 2002-0001555 A | 1/2002 |
| KR | 2002-0025760 | 4/2002 |
| KR | 10-2002-0050922 | 6/2002 |
| KR | 10-2002-0090934 | 12/2002 |
| KR | 10-2002-0091457 A | 12/2002 |
| KR | 2003-0001745 A | 1/2003 |
| KR | 2003-0034730 A | 5/2003 |
| KR | 10-2003-0043012 A | 6/2003 |
| KR | 2003-0046090 A | 6/2003 |
| KR | 2003-0069684 A | 8/2003 |
| KR | 10-0405080 | 11/2003 |
| KR | 10-0406059 B1 | 11/2003 |
| KR | 10-2003-0091947 | 12/2003 |
| KR | 10-2003-0093959 | 12/2003 |
| KR | 10-2003-0094033 | 12/2003 |
| KR | 10-2004-0014258 A | 2/2004 |
| KR | 20-0342433 Y1 | 2/2004 |
| KR | 10-2004-0034537 | 4/2004 |
| KR | 10-2004-0039910 A | 5/2004 |
| KR | 10-0430336 B1 | 5/2004 |
| KR | 10-2004-0050045 | 6/2004 |
| KR | 10-2004-0069281 | 8/2004 |
| KR | 10-2004-0084747 | 10/2004 |
| KR | 10-2004-0087142 A | 10/2004 |
| KR | 10-2004-0110718 A | 12/2004 |
| KR | 10-0463212 | 12/2004 |
| KR | 10-2005-0018234 A | 2/2005 |
| KR | 10-2005-0024324 A | 3/2005 |
| KR | 10-2005-0028943 | 3/2005 |
| KR | 10-2005-0039140 A | 4/2005 |
| KR | 10-0483487 B1 | 4/2005 |
| KR | 10-2005-0062853 A | 6/2005 |
| KR | 10-2005-0082644 A | 8/2005 |
| KR | 10-0520159 | 10/2005 |
| KR | 10-0532657 B1 | 12/2005 |
| KR | 10-2006-0008602 | 1/2006 |
| KR | 10-2006-0018745 | 3/2006 |
| KR | 10-2006-0020050 A | 3/2006 |
| KR | 10-2006-0045225 A | 5/2006 |
| KR | 10-2006-0049050 A | 5/2006 |
| KR | 10-2006-0051746 A | 5/2006 |
| KR | 10-2006-0053926 A | 5/2006 |

(56) References Cited

FOREIGN PATENT DOCUMENTS

| | | |
|---|---|---|
| KR | 10-2006-0056706 A | 5/2006 |
| KR | 10-2006-0058459 A | 5/2006 |
| KR | 10-2006-0059068 A | 6/2006 |
| KR | 10-2006-0059323 A | 6/2006 |
| KR | 10-2006-0060994 | 6/2006 |
| KR | 10-2006-0065978 A | 6/2006 |
| KR | 10-2006-0073367 | 6/2006 |
| KR | 10-2006-0077887 A | 7/2006 |
| KR | 10-2006-0080475 | 7/2006 |
| KR | 10-2006-0080481 | 7/2006 |
| KR | 10-2006-0080482 | 7/2006 |
| KR | 10-2006-0081943 A | 7/2006 |
| KR | 10-2006-0083510 | 7/2006 |
| KR | 10-2006-0092387 A | 8/2006 |
| KR | 10-2006-0098755 A | 9/2006 |
| KR | 10-2006-0104288 A | 10/2006 |
| KR | 10-2006-0104675 | 10/2006 |
| KR | 10-2006-0104677 | 10/2006 |
| KR | 10-2006-0109561 A | 10/2006 |
| KR | 10-2006-0109627 | 10/2006 |
| KR | 10-0635903 B1 | 10/2006 |
| KR | 10-2006-0114462 A | 11/2006 |
| KR | 10-2006-0114477 A | 11/2006 |
| KR | 10-2006-0114573 A | 11/2006 |
| KR | 10-0645719 B1 | 11/2006 |
| KR | 10-0646160 | 11/2006 |
| KR | 10-2006-0123944 A | 12/2006 |
| KR | 10-0687007 | 2/2007 |
| KR | 10-0696547 B1 | 3/2007 |
| KR | 10-0696550 B1 | 3/2007 |
| KR | 10-0697663 B1 | 3/2007 |
| KR | 10-0698033 | 3/2007 |
| KR | 10-0700466 | 3/2007 |
| KR | 10-2007-0035796 | 4/2007 |
| KR | 10-2007-0037848 A | 4/2007 |
| KR | 10-0711885 | 4/2007 |
| KR | 10-2007-0050793 | 5/2007 |
| KR | 10-0723627 B1 | 5/2007 |
| KR | 10-2007-0056190 A | 6/2007 |
| KR | 10-0726132 | 6/2007 |
| KR | 10-0736218 B1 | 7/2007 |
| KR | 10-0739309 B1 | 7/2007 |
| KR | 10-0741142 B1 | 7/2007 |
| KR | 10-2007-0078713 | 8/2007 |
| KR | 10-2007-0080635 | 8/2007 |
| KR | 10-2007-0091437 A | 9/2007 |
| KR | 10-2006-0028115 | 10/2007 |
| KR | 10-2007-0097218 | 10/2007 |
| KR | 10-2007-0098122 A | 10/2007 |
| KR | 10-2007-0101842 | 10/2007 |
| KR | 10-2007-0105595 | 10/2007 |
| KR | 10-0768212 B1 | 10/2007 |
| KR | 10-0770653 B1 | 10/2007 |
| KR | 10-2007-0112668 A | 11/2007 |
| KR | 10-2007-0114094 A | 11/2007 |
| KR | 10-0787457 B1 | 12/2007 |
| KR | 10-2008-0001184 | 1/2008 |
| KR | 10-2008-0003720 A | 1/2008 |
| KR | 10-2008-0007896 A | 1/2008 |
| KR | 10-2008-0009285 A | 1/2008 |
| KR | 10-0797787 B1 | 1/2008 |
| KR | 10-0800125 B1 | 1/2008 |
| KR | 10-0815265 | 3/2008 |
| KR | 10-2008-0036983 A | 4/2008 |
| KR | 10-0823508 B1 | 4/2008 |
| KR | 10-0823511 B1 | 4/2008 |
| KR | 10-2008-0044239 A | 5/2008 |
| KR | 10-2008-0044775 A | 5/2008 |
| KR | 10-2008-0046761 A | 5/2008 |
| KR | 10-0827760 B1 | 5/2008 |
| KR | 10-2008-0048653 | 6/2008 |
| KR | 10-2008-0055124 A | 6/2008 |
| KR | 10-2008-0057159 A | 6/2008 |
| KR | 10-0839380 B1 | 6/2008 |
| KR | 10-2008-0060400 | 7/2008 |
| KR | 10-2008-0061132 | 7/2008 |
| KR | 10-2008-0061666 | 7/2008 |
| KR | 10-2008-0061774 A | 7/2008 |
| KR | 10-2008-0062212 | 7/2008 |
| KR | 10-2008-0076574 A | 8/2008 |
| KR | 10-2008-0088737 A | 10/2008 |
| KR | 10-2008-0104479 A | 12/2008 |
| KR | 10-2008/0104695 A | 12/2008 |
| KR | 10-2008-0109559 A | 12/2008 |
| KR | 10-2009-0017910 A | 2/2009 |
| KR | 10-0889872 B1 | 3/2009 |
| KR | 10-2009-0038733 | 4/2009 |
| KR | 10-2009-0040618 A | 4/2009 |
| KR | 10-2009-0047953 A | 5/2009 |
| KR | 10-2009-0052155 A | 5/2009 |
| KR | 10-2009-0052828 A | 5/2009 |
| KR | 10-2009-0053417 A | 5/2009 |
| KR | 10-0899279 B1 | 5/2009 |
| KR | 10-2009-0066996 | 6/2009 |
| KR | 10-2009-0075887 A | 7/2009 |
| KR | 10-2009-0079765 A | 7/2009 |
| KR | 10-2009-0081717 A | 7/2009 |
| KR | 10-0908232 B1 | 7/2009 |
| KR | 10-2009-0093161 A | 9/2009 |
| KR | 10-2009-0094911 A | 9/2009 |
| KR | 10-2009-0097453 | 9/2009 |
| KR | 10-2009-0107702 | 10/2009 |
| KR | 10-0922763 A | 10/2009 |
| KR | 10-2010-0000128 A | 1/2010 |
| KR | 10-2010-0000129 A | 1/2010 |
| KR | 10-2010-0002381 A | 1/2010 |
| KR | 10-2010-0026655 A | 3/2010 |
| KR | 10-2010-0038088 A | 4/2010 |
| KR | 10-2010-0044606 A | 4/2010 |
| KR | 10-2010-0047796 | 5/2010 |
| KR | 10-0961110 B1 | 6/2010 |
| KR | 10-2010-0090070 A | 8/2010 |
| KR | 10-2010-0099806 A | 9/2010 |
| KR | 10-2010-0119368 A | 11/2010 |
| KR | 10-2010-0126125 A | 12/2010 |
| KR | 10-2010-0128589 A | 12/2010 |
| KR | 10-2010-0130786 A | 12/2010 |
| KR | 10-2010-0133678 A | 12/2010 |
| KR | 10-2010-0138139 A | 12/2010 |
| KR | 10-1017654 B1 | 2/2011 |
| KR | 10-2011-0021090 A | 3/2011 |
| KR | 10-2011-0022512 A | 3/2011 |
| KR | 10-2011-0032589 A | 3/2011 |
| KR | 10-2011-0082418 A | 7/2011 |
| KR | 10-2011-0101767 A | 9/2011 |
| KR | 10-2011-0110525 A | 10/2011 |
| KR | 10-2011-0120213 A | 11/2011 |
| KR | 10-2011-0138787 A | 12/2011 |
| KR | 10-2012-0006322 A | 1/2012 |
| KR | 10-2012-0006324 A | 1/2012 |
| KR | 10-2012-0012300 | 2/2012 |
| KR | 10-2012-0042155 A | 5/2012 |
| KR | 10-2012-0065789 A | 6/2012 |
| KR | 10-2012-0080855 A | 7/2012 |
| KR | 10-2012-0081811 A | 7/2012 |
| KR | 10-1193186 B1 | 10/2012 |
| KR | 10-2012-0131545 A | 12/2012 |
| KR | 10-2013-0007308 A | 1/2013 |
| WO | 9925894 A1 | 5/1999 |
| WO | 03043067 A1 | 5/2003 |
| WO | WO2004016406 A1 | 2/2004 |
| WO | 2008004792 A1 | 1/2008 |

OTHER PUBLICATIONS

KIPO Registration Determination Certificate dated Oct. 31, 2011, for Korean Patent application 10-2010-0014273, 5 pages.
Patent Abstracts of Japan, and English machine translation of Japanese Publication 2001-052862, 20 pages.
Patent Abstracts of Japan, and English machine translation of Japanese Publication 2003-003250, 25 pages.
Korean Patent Abstracts, Publication No. 1020020086047, dated Nov. 18, 2002, for corresponding Korean Patent 10-0405080.

(56) References Cited

OTHER PUBLICATIONS

Korean Patent Abstracts, Publication No. 1020020088662, dated Nov. 29, 2002, for corresponding Korean Patent 10-0463212.
Korean Patent Abstracts, Publication No. 1020050045619, dated May 17, 2005, for corresponding Korean Patent 10-0520159.
Korean Patent Abstracts, Publication No. 1020040062203, dated Jul. 7, 2002, for corresponding Korean Patent 10-0646160.
Korean Patent Abstracts, Publication No. 1020060101987, dated Sep. 27, 2006, for corresponding Korean Patent 10-0687007.
Korean Patent Abstracts, Publication No. 1020020056238, dated Jul. 10, 2002, for corresponding Korean Patent 10-0698033.
Korean Patent Abstracts, Publication No. 1020050078637, dated Aug. 5, 2005, for corresponding Korean Patent 10-0700466.
Korean Patent Abstracts, Publication No. 1020070025164, dated Mar. 8, 2007, for corresponding Korean Patent 10-0711885.
Korean Patent Abstracts, Publication No. 1020020034272, dated May 9, 2002, for corresponding Korean Patent 10-0726132.
Korean Patent Abstracts, Publication No. 1020060126267, dated Dec. 6, 2006, for corresponding Korean Patent 10-0797787.
English Abstract, Publication No. 1020080002189, dated Jan. 4, 2008, for corresponding Korean Patent 10-0800125.
Korean Patent Abstracts, Publication No. 1020070050793. dated May 16, 2007, for corresponding Korean Patent 10-0815265.
Korean Patent Abstracts, Publication No. 1020010062735, dated Jul. 7, 2001, for corresponding Korean Patent 10-0827760.
Korean Patent Abstracts, Publication No. 1020080038650, dated May 7, 2008, for corresponding Korean Patent 10-0839380.
U.S. Notice of Allowance dated Oct. 28, 2014, issued to U.S. Appl. No. 13/014,225 (64 pages).
U.S. Office action dated Dec. 31, 2014 issued to U.S. Appl. No. 12/873,556, (72 pages).
U.S. Office action dated Dec. 31, 2014 issued to U.S. Appl. No. 13/469,029 (74 pages).
U.S. Office action dated Nov. 14, 2014, issued to U.S. Appl. No. 13/178,472 (10 pages).
U.S. Office action dated Sep. 26, 2014, issued to U.S. Appl. No. 12/868,099 (66 pages).
European Search Report dated May 13, 2011 for European Application No. 11250019.4 (6 pages).
European Search Report dated May 20, 2011 for European Application No. 10251404.9 (12 pages).
European Search Report dated May 27, 2011 for European Application No. 10251514.5 (11 pages).
European Search Report dated Sep. 6, 2010 for European Application No. 10250962.7 (5 pages).
Japanese Patent Office Action dated Jan. 22, 2013 for Japanese Application No. 2010-116470, (3 pages).
Japanese Patent Office Action dated Jan. 8, 2013 for Japanese Application No. 2011-000180 (3 pages).
Japanese Patent Office Action dated Mar. 19, 2013 for Japanese Application No. 2011-097909, (3 pages).
JP Office action dated Aug. 21, 2012, issued to JP Application No. 2010-145075 (5 pages).
JP Office action dated Sep. 4, 2012, issued to JP Application No. 2010-152846 (4 pages).
JPO Office action dated Apr. 1, 2014, for Japanese Patent application 2010-286245 (4 pages).
JPO Office action dated Feb. 25, 2014, for corresponding Japanese Patent application 2013-128405 (3 pages).
JPO Office action dated Jan. 28, 2014, for corresponding Japanese Patent application 2011-097909 (4 pages).
KIPO Notice of Allowance dated Apr. 26, 2012 for Korean Application No. 10-2010-0066991 (5 pages).
KIPO Notice of Allowance dated Apr. 30, 2012, issued to KR 10-2010-0066992 (5 pages).
KIPO Notice of Allowance dated Aug. 24, 2012, issued to KR 10-2010-0066993 (5 pages).
KIPO Notice of Allowance dated Jul. 20, 2012, issued to KR 10-2010-0003545 (5 pages).
KIPO Notice of Allowance dated Oct. 27, 2011 for Korean Application No. 10-2010-0002381 (5 pages).
KIPO Notice of Allowance dated Sep. 1, 2012, for Korean Patent application 10-2010-0013847 (5 pages).
KIPO Notice of Allowance dated Sep. 1, 2012, issued to KR 10-2010-0009160 (5 pages).
KIPO Notice of Allowance dated Sep. 1, 2012, issued to KR 10-2010-0013848 (5 pages).
KIPO Notice of Allowance dated Sep. 23, 2011 for Korean Application No. 10-2009-0055473 (5 pages).
KIPO Notice of Allowance dated Sep. 28, 2011 for Korean Application No. 10-2009-0045201 (5 pages).
KIPO Notice of Allowance dated Sep. 28, 2011 for Korean Application No. 10-2009-0052359 (5 pages).
KIPO Notice of Allowance, dated Nov. 25, 2011, issued to KR 10-2010-0014277 (5 pages).
KIPO Notice of Allowance, dated Sep. 1, 2012, issued to KR 10-2010-0014276 (5 pages).
KIPO Notice of Allowance, dated Sep. 28, 2011, issued to KR 10-2009-0052357 (5 pages).
KIPO Office action dated Apr. 2, 2012, issued to KR 10-2010-0066993 (4 pages).
KIPO Office action dated Apr. 4, 2012, issued in KR Application No. 10-2009-0112796 (5 pages).
KIPO Office Action dated Apr. 9, 2012 for Korean Application No. 10-2010-0031556 (4 pages).
KIPO Office action dated Aug. 1, 2011, issued to KR 10-2009-0074001 (3 pages).
KIPO Office Action dated Aug. 28, 2012, issued to KR 10-2010-0014274 (5 pages).
KIPO Office action dated Feb. 1, 2012, for Korean Patent application 10-2010-0013847 (5 pages).
KIPO Office action dated Feb. 1, 2012, issued to KR 10-2010-0011196 (4 pages).
KIPO Office action dated Feb. 1, 2012, issued to KR 10-2010-0013848 (4 pages).
KIPO Office action dated Feb. 1, 2012, issued to KR 10-2010-0014272 (4 pages).
KIPO Office Action dated Feb. 6, 2012 for Korean Application No. 10-2010-0011480 (8 pages).
KIPO Office Action dated Feb. 6, 2012 for Korean Application No. 10-2010-0011481 (7 pages).
KIPO Office Action dated Feb. 6, 2012, issued to KR 10-2010-0021835 (4 pages).
KIPO Office action dated Jan. 13, 2012, issued to KR 10-2009-0056529 (5 pages).
KIPO Office action dated Jan. 6, 2012, issued to KR Application No. 10-2010-0000897 (4 pages).
KIPO Office action dated Jul. 1, 2011, issued to KR Application No. 10-2009-0072111 (4 pages).
KIPO Office action dated Jun. 1, 2011, issued to KR Application No. 10-2009-0050528 (4 pages).
KIPO Office action dated Mar. 21, 2012, issued to KR Application No. 10-2010-0065465 (5 pages).
KIPO Office action dated Sep. 1, 2012, issued to KR 10-2010-0010136 (5 pages).
KIPO Registration Determination Certificate dated Jul. 2, 2012, for Korean Application No. 10-2010-0011480 (5 pages).
KIPO Registration Determination Certificate dated Jul. 2, 2012, for Korean Application No. 10-2010-0011481 (5 pages).
KIPO Registration Determination Certificate dated Nov. 30, 2011, for Korean application 10-2009-0056530 (5 pages).
KIPO Registration Determination Certificate, dated Jul. 20, 2012, issued to KR Application No. 10-2010-0000897 (5 pages).
Korean Registration Certificate dated Sep. 28, 2011 for Korean Application No. 10-2009-0045200 (5 pages).
SIPO Certificate of Patent dated Aug. 14, 2013, for Chinese application 201010266406.6, (36 pages).
SIPO Certificate of Patent dated Jul. 31, 2013, corresponding to Chinese Patent application 201110029291.3, (31 pages).
SIPO Office action dated Dec. 17, 2013, for Chinese Patent application 201010216896.9 (6 pages).

(56) References Cited

OTHER PUBLICATIONS

SIPO Office action dated Feb. 14, 2014, for corresponding Chinese Patent application 201010189614.0 (16 pages).
SIPO Office action dated Mar. 11, 2014, for corresponding Chinese Patent application 201010189581.X (9 pages).
SIPO Office Action dated May 29, 2013, for Chinese Application No. 201010189614.0 (12 pages).
SIPO Office Action dated Nov. 28, 2012 for Chinese Application No. 201110029291.3 (11 pages).
SIPO Office Action dated Oct. 9, 2012 for Chinese Application No. 201010266406.6 (6 pages).
Taiwanese Office action dated Apr. 14, 2014, for Taiwanese Patent application 100114360 (20 pages).
Taiwanese Office action dated Dec. 20, 2013, for Taiwanese Patent application 099116077 (8 pages).
U.S. Interview Summary dated Mar. 11, 2014 for U.S. Appl. No. 12/813,786 (4 pages).
U.S. Notice of Allowance dated Feb. 20, 2014, issued to U.S. Appl. No. 12/907,396 (13 pages).
U.S. Notice of Allowance dated Feb. 28, 2014, issued to U.S. Appl. No. 13/279,077 (12 pages).
U.S. Notice of Allowance dated Jun. 11, 2014, issued to U.S. Appl. No. 13/468,835 (62 pages).
U.S. Notice of Allowance dated Jun. 30, 2014, issued to U.S. Appl. No. 12/907,396 (40 pages).
U.S. Notice of Allowance dated May 9, 2014 for U.S. Appl. No. 13/194,759 (27 pages).
U.S. Office action dated Apr. 1, 2013, issued to U.S. Appl. No. 12/784,774 (44 pages).
U.S. Office action dated Apr. 29, 2013, issued to U.S. Appl. No. 12/820,355 (31 pages).
U.S. Office action dated Aug. 13, 2013, issued to U.S. Appl. No. 13/194,759, (28 pages).
U.S. Office Action dated Aug. 2, 2013 for U.S. Appl. No. 12/868,099 (32 pages).
U.S. Office action dated Aug. 21, 2013 issued in cross-reference U.S. Appl. No. 12/820,355 (14 pages).
U.S. Office action dated Aug. 8, 2013, for cross reference U.S. Appl. No. 13/093,707, (7 pages).
U.S. Office Action dated Dec. 13, 2011 for U.S. Appl. No. 12/849,193 (30 pages).
U.S. Office action dated Dec. 13, 2013, issued to U.S. Appl. No. 13/180,454 (18 pages).
U.S. Office action dated Dec. 16, 2013 for U.S. Appl. No. 14/054,536 (35 pages).
U.S. Office action dated Dec. 17, 2012, issued to U.S. Appl. No. 12/873,556 (37 pages).
U.S. Office action dated Dec. 2, 2013, issued to U.S. Appl. No. 13/157,220 (33 pages).
U.S. Office action dated Dec. 26, 2012, issued to U.S. Appl. No. 12/815,673 (21 pages).
U.S. Office action dated Feb. 11, 2014, for cross reference U.S. Appl. No. 13/178,472 (8 pages).
U.S. Office action dated Feb. 26, 2013, issued to U.S. Appl. No. 12/794,093 (31 pages).
U.S. Office action dated Feb. 6, 2014, for U.S. Appl. No. 12/984,231 (16 pages).
U.S. Office action dated Jul. 11, 2013 for U.S. Appl. No. 13/461,669 (27 pages).
U.S. Office action dated Jul. 17, 2013, issued to U.S. Appl. No. 12/984,231, (18 pages).
U.S. Office action dated Jul. 24, 2013, issued to U.S. Appl. No. 12/784,804, (52 pages).
U.S. Office action dated Jul. 3, 2013 in U.S. Appl. No. 12/873,689 (48 pages).
U.S. Office action dated Jul. 5, 2013, issued to U.S. Appl. No. 12/873,556, (17 pages).
U.S. Office Action dated Jun. 11, 2013 for U.S. Appl. No. 12/979,656 (50 pages).
U.S. Office action dated Jun. 11, 2013, issued to U.S. Appl. No. 12/862,125 (37 pages).
U.S. Office action dated Jun. 17, 2013, for cross reference U.S. Appl. No. 13/180,454, (23 pages).
U.S. Office action dated Jun. 17, 2014, issued to U.S. Appl. No. 13/157,220 (36 pages).
U.S. Office Action dated Jun. 21, 2011 for U.S. Appl. No. 12/862,153 (21 pages).
U.S. Office action dated Jun. 26, 2013, issued to U.S. Appl. No. 12/794,093 (20 pages).
U.S. Office action dated Mar. 15, 2013, issued to U.S. Appl. No. 12/813,786 (33 pages).
U.S. Office action dated Mar. 17, 2014, for U.S. Appl. No. 12/950,361 (48 pages).
U.S. Office action dated Mar. 18, 2013, issued to U.S. Appl. No. 12/984,231 (29 pages).
U.S. Office action dated Mar. 19, 2013, issued to U.S. Appl. No. 13/194,759 (36 pages).
U.S. Office action dated Mar. 22, 2013, issued to U.S. Appl. No. 12/987,569 (12 pages).
U.S. Office Action dated Mar. 23, 2012 for U.S. Appl. No. 12/849,193 (17 pages).
U.S. Office action dated May 22, 2013, for cross reference U.S. Appl. No. 13/219,427, (26 pages).
U.S. Office action dated May 24, 2013, for U.S. Appl. No. 13/279,077 (20 pages).
U.S. Office action dated May 24, 2013, issued to U.S. Appl. No. 12/849,092 (31 pages).
U.S. Office action dated May 6, 2014, issued to U.S. Appl. No. 13/467,998 (21 pages).
U.S. Office Action dated May 7, 2013, issued in U.S. Appl. No. 12/820,270 (37 pages).
U.S. Office action dated Nov. 20, 2013, for cross reference U.S. Appl. No. 12/868,099, (14 pages).
U.S. Office action dated Nov. 22, 2013, issued to U.S. Appl. No. 13/198,591, (28 pages).
U.S. Office action dated Nov. 25, 2013, issued to U.S. Appl. No. 13/176,701, (49 pages).
U.S. Office action dated Nov. 4, 2013, for U.S. Appl. No. 13/219,427, (26 pages).
U.S. Office action dated Oct. 1, 2013, issued to U.S. Appl. No. 12/849,092, (13 pages).
U.S. Office action dated Oct. 11, 2013, issued to U.S. Appl. No. 12/907,396, (44 pages).
U.S. Office action dated Oct. 21, 2013, issued to U.S. Appl. No. 12/987,569, (14 pages).
U.S. Office Action dated Oct. 3, 2012 for U.S. Appl. No. 12/869,830 (28 pages).
U.S. Office action dated Oct. 7, 2013, issued to U.S. Appl. No. 13/279,077, (29 pages).
U.S. Office action dated Sep. 25, 2013, for U.S. Appl. No. 13/031,756, (34 pages).
U.S. Patent Office Action dated May 16, 2013, issued to U.S. Appl. No. 13/235,337 (28 pages).
US Notice of Allowance, dated Mar. 18, 2013, issued to U.S. Appl. No. 12/795,001 (29 pages).
US Office action dated Dec. 20, 2012, issued to U.S. Appl. No. 12/984,289 (20pages).
US Office action dated Sep. 12, 2012, in U.S. Appl. No. 12/815,673 (26 pages).
SIPO Office action dated Apr. 3, 2015, corresponding to Chinese Patent application 201210008397.X, (7 pages).
JPO Office action dated Jan. 20, 2015 for corresponding Japanese Patent application 2011-118686 (5 pages).
SIPO Office action dated Feb. 2, 2015, for corresponding Chinese Patent application 201110199594.X (12 pages).
U.S. Notice of Allowance dated Nov. 7, 2014, for U.S. Appl. No. 13/475,835, (26 pages).
U.S. Notice of Allowance dated Oct. 29, 2015, for cross reference U.S. Appl. No. 13/157,220, (96 pages).
U.S. Office action dated Aug. 10, 2015, for cross reference U.S. Appl. No. 13/157,220, (146 pages).

(56) References Cited

OTHER PUBLICATIONS

U.S. Office action dated Dec. 15, 2015, for U.S. Appl. No. 12/873,556, (29 pages).
U.S. Office action dated Dec. 2, 2015, for cross reference U.S. Appl. No. 13/176,701, (79 pages).
Patent Abstracts of Japan, and English machine translation of Japanese Publication 2001-052862, 20 pages, Japanese published Feb. 23, 2001.
Patent Abstracts of Japan, and English machine translation of Japanese Publication 2003-003250, 25 pages, Japanese Published Jan. 8, 2003.
Korean Patent Abstracts, Publication No. 1020020086047, dated Nov. 18, 2002, for corresponding Korean Patent 10-0405080 listed above.
Korean Patent Abstracts, Publication No. 1020020088662, dated Nov. 29, 2002, for corresponding Korean Patent 10-0463212 listed above.
Korean Patent Abstracts, Publication No. 1020050045619, dated May 17, 2005, for corresponding Korean Patent 10-0520159 listed above.
Korean Patent Abstracts, Publication No. 1020040062203, dated Jul. 7, 2002, for corresponding Korean Patent 10-0646160 listed above.
Korean Patent Abstracts, Publication No. 1020060101987, dated Sep. 27, 2006, for corresponding Korean Patent 10-0687007 listed above.
Korean Patent Abstracts, Publication No. 1020020056238, dated Jul. 10, 2002, for corresponding Korean Patent 10-0698033 listed above.
Korean Patent Abstracts, Publication No. 1020050078637, dated Aug. 5, 2005, for corresponding Korean Patent 10-0700466 listed above.
Korean Patent Abstracts, Publication No. 1020070025164, dated Mar. 8, 2007, for corresponding Korean Patent 10-0711885 listed above.
Korean Patent Abstracts, Publication No. 1020020034272, dated May 9, 2002, for corresponding Korean Patent 10-0726132 listed above.
Korean Patent Abstracts, Publication No. 1020060126267, dated Dec. 6, 2006, for corresponding Korean Patent 10-0797787 listed above.
English Abstract, Publication No. 1020080002189, dated Jan. 4, 2008, for corresponding Korean Patent 10-0800125 listed above.
Korean Patent Abstracts, Publication No. 1020070050793. dated May 16, 2007, for corresponding Korean Patent 10-0815265 listed above.
Korean Patent Abstracts, Publication No. 1020010062735, dated Jul. 7, 2001, for corresponding Korean Patent 10-0827760 listed above.
Korean Patent Abstracts, Publication No. 1020080038650, dated May 7, 2008, for corresponding Korean Patent 10-0839380 listed above.

\* cited by examiner

ORGANIC FILM DEPOSITION APPARATUS AND METHOD OF MANUFACTURING ORGANIC LIGHT-EMITTING DISPLAY DEVICE BY USING THE SAME

CROSS-REFERENCE TO RELATED APPLICATION

This application claims priority to and the benefit of Korean Patent Application No. 10-2010-0103678, filed on Oct. 22, 2010, in the Korean Intellectual Property Office, the entire disclosure of which is incorporated herein by reference.

BACKGROUND

1. Field

Aspects of embodiments according to the present invention relate to an organic film deposition apparatus and a method of manufacturing an organic light-emitting display device by using the same.

2. Description of Related Art

Organic light-emitting display devices have a larger viewing angle, better contrast characteristics, and faster response speeds than other display devices, and thus have drawn attention as next-generation display devices.

Organic light-emitting display devices generally have a stacked structure including an anode, a cathode, and an emission layer interposed between the anode and the cathode. The devices display images in color when holes and electrons, injected respectively from the anode and the cathode, recombine in the emission layer such that light is emitted. However, it is difficult to achieve a high light-emission efficiency with such a structure, and thus one or more intermediate layers, such as an electron injection layer, an electron transport layer, a hole transport layer, a hole injection layer, and the like may be additionally interposed between the emission layer and one or both of the electrodes.

However, it is very difficult in practice to form fine patterns with organic thin films, such as the emission layer and intermediate layers, and red, green and blue light-emission efficiencies vary according to characteristics of the organic thin films. For these reasons, conventional organic film deposition apparatuses may not be suitable for patterning on large substrates. Thus, it is difficult to manufacture large organic light-emitting display devices having satisfactory driving voltages, current densities, brightnesses, color purities, light emission efficiencies, and life span characteristics, and there are still demands for improvements in this regard.

SUMMARY

Exemplary embodiments according to the present invention provide an organic film deposition apparatus that may be easily manufactured, that may be applied to the manufacture of large-size display devices on a mass scale in a simple fashion, and that may improve manufacturing yield and deposition efficiency, and a method of manufacturing an organic light-emitting display device by using the organic film deposition apparatus.

According to an embodiment of the present invention, there is provided an organic film deposition apparatus for forming an organic film on a substrate, the apparatus including: a deposition source configured to discharge a deposition material; a deposition source nozzle unit located at a side of the deposition source and including a plurality of deposition source nozzles arranged in a first direction; a patterning slit sheet located opposite to and spaced apart from the deposition source nozzle unit and having a plurality of patterning slits arranged in a second direction perpendicular to the first direction; a first blocking member located between the substrate and the deposition source and movable together with the substrate to be positioned to screen at least a part of the substrate; and a second blocking member located between the first blocking member and the substrate and held in a fixed position relative to the deposition source, wherein the substrate is spaced apart from the organic film deposition apparatus and at least one of the substrate or the organic film deposition apparatus is configured to move relative to the other.

The first blocking member may be positioned to screen a non-deposition region of the substrate.

The first blocking member may be positioned to screen either a first non-deposition region at an end region of the substrate or a second non-deposition region at an opposite end region of the substrate.

The first blocking member may be configured to start moving together with the substrate after the substrate is moved until the first or second non-deposition region of the substrate is directly above the first blocking member.

The first blocking member may have a planar shape.

The second blocking member may have an open mask shape.

The first blocking member may be moved in a direction parallel to the substrate at the same speed as the substrate.

While the first blocking member is moved together with the substrate, a relative position of the first blocking member with respect to the substrate may be constantly maintained.

The patterning slit sheet may be smaller than the substrate.

According to another embodiment of the present invention, there is provided an organic film deposition apparatus for forming an organic film on a substrate, the apparatus including: a deposition source configured to discharge a deposition material; a deposition source nozzle unit located at a side of the deposition source and including a plurality of deposition source nozzles arranged in a first direction; a patterning slit sheet located opposite to the deposition source nozzle unit and having a plurality of patterning slits arranged in the first direction; a barrier plate assembly including a plurality of barrier plates that are arranged in the first direction and located between the deposition source nozzle unit and the patterning slit sheet, the barrier plates partitioning a space between the deposition source nozzle unit and the patterning slit sheet into a plurality of sub-deposition spaces; a first blocking member located between the substrate and the deposition source and movable together with the substrate to be positioned to screen at least a part of the substrate; and a second blocking member located between the first blocking member and the substrate and held in a fixed position relative to the deposition source, wherein the substrate is spaced apart from the organic film deposition apparatus and at least one of the substrate or the organic film deposition apparatus is configured to move relative to the other.

The first blocking member may be positioned to screen a non-deposition region of the substrate.

The first blocking member may be positioned to screen either a first non-deposition region at an end region of the substrate or a second non-deposition region at an opposite end region of the substrate.

The first blocking member may be configured to start moving together with the substrate after the substrate is moved until the first or second non-deposition region of the substrate is directly above the first blocking member.

The first blocking member may have a planar shape.

The second blocking member may have an open mask shape.

The first blocking member may be moved in a direction parallel to the substrate at the same speed as the substrate.

While the first blocking member is moved together with the substrate, a relative position of the first blocking member to the substrate may be constantly maintained.

The patterning slit sheet may be smaller than the substrate.

The plurality of barrier plates may extend in a second direction substantially perpendicular to the first direction.

According to an embodiment of the present invention, there is provided a method of manufacturing an organic light-emitting display device by using an organic film deposition apparatus for forming an organic film on a substrate, the method including: arranging the substrate to be spaced apart from the organic film deposition apparatus; and depositing a deposition material discharged from the organic film deposition apparatus on the substrate while moving the substrate relative to the organic film deposition apparatus, wherein the depositing of the deposition material on the substrate further includes: placing a second blocking member in a fixed position; moving a first blocking member together with a first non-deposition region of the substrate while the deposition material is deposited on the substrate; moving the first blocking member back to an original position; and moving the first blocking member together with a second non-deposition region of the substrate while the deposition material is deposited on the substrate.

In the moving of the first blocking member together with the first non-deposition region of the substrate while the deposition material is deposited on the substrate, the first blocking member may be moved while being overlapped with the first non-deposition region of the substrate. In the moving of the first blocking member together with the second non-deposition region of the substrate while the deposition material is deposited on the substrate, the first blocking member may be moved while being overlapped with the second non-deposition region of the substrate.

In the moving of the first blocking member together with the first non-deposition region of the substrate or together with the second non-deposition region of the substrate, the first blocking member may be moved in a direction parallel to the substrate at the same speed as the substrate while the deposition material is deposited on the substrate.

In the moving of the first blocking member together with the first non-deposition region of the substrate or together with the second non-deposition region of the substrate, a relative position of the first blocking member to the substrate may remain the same while the first blocking member is moved together with the substrate.

In the moving of the first blocking member back to the original position, the first blocking member may be moved at a higher speed than the substrate.

In the moving of the first blocking member together with the first non-deposition region of the substrate while the deposition material is deposited on the substrate, the first blocking member may start to be moved together with the substrate when the first non-deposition region of the moving substrate is above the first blocking member in a position overlapping with a first region of the second blocking member.

The method may further include, between the moving of the first blocking member together with the first non-deposition region of the substrate and the moving the first blocking member back to the original position, holding the first blocking member in a position overlapping with a second region of the second blocking member.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE EMBODIMENTS

Reference will now be made in detail to embodiments of the present invention, examples of which are illustrated in the accompanying drawings. The present invention may, however, be embodied in many different forms and should not be construed as being limited to the embodiments set forth herein; rather, these embodiments are provided so that this disclosure will be thorough and complete, and will fully convey the concept of the present invention to those of ordinary skill in the art.

Figure 1:
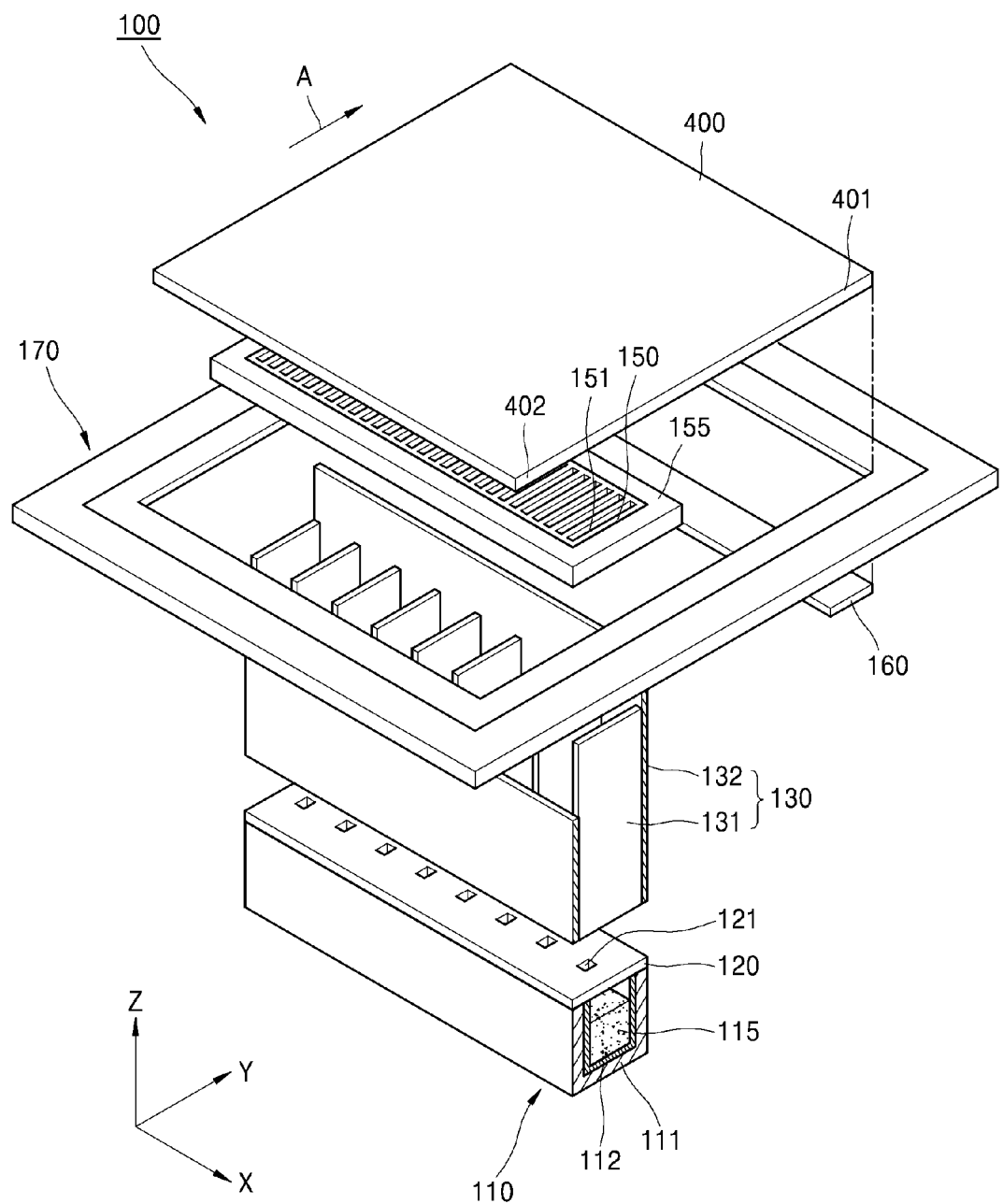
FIG. 1 is a schematic perspective view of an organic film deposition apparatus according to an embodiment of the present invention.
Figure 2:
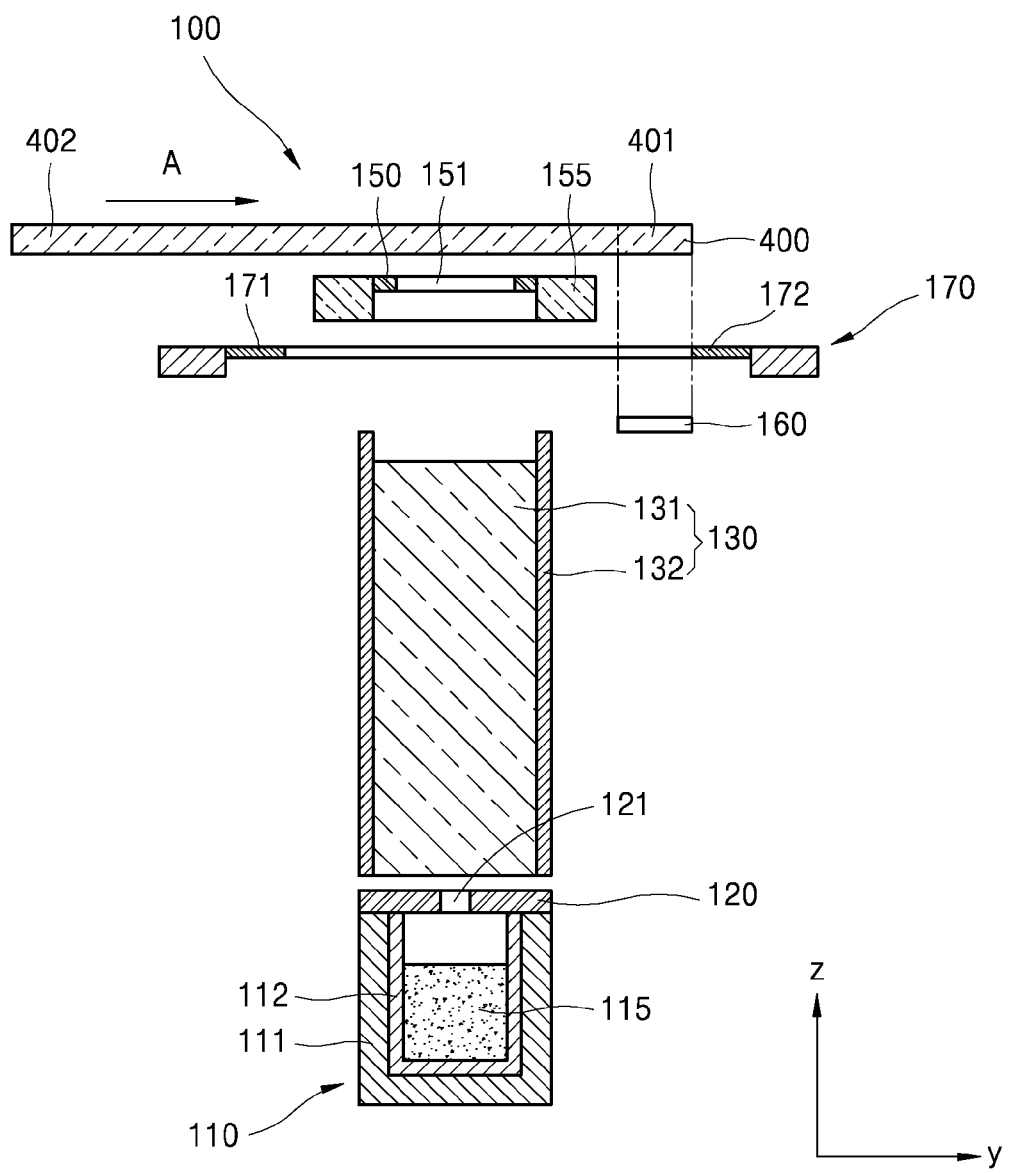
FIG. 2 is a schematic sectional side view of the organic film deposition apparatus of FIG. 1.
Figure 3:
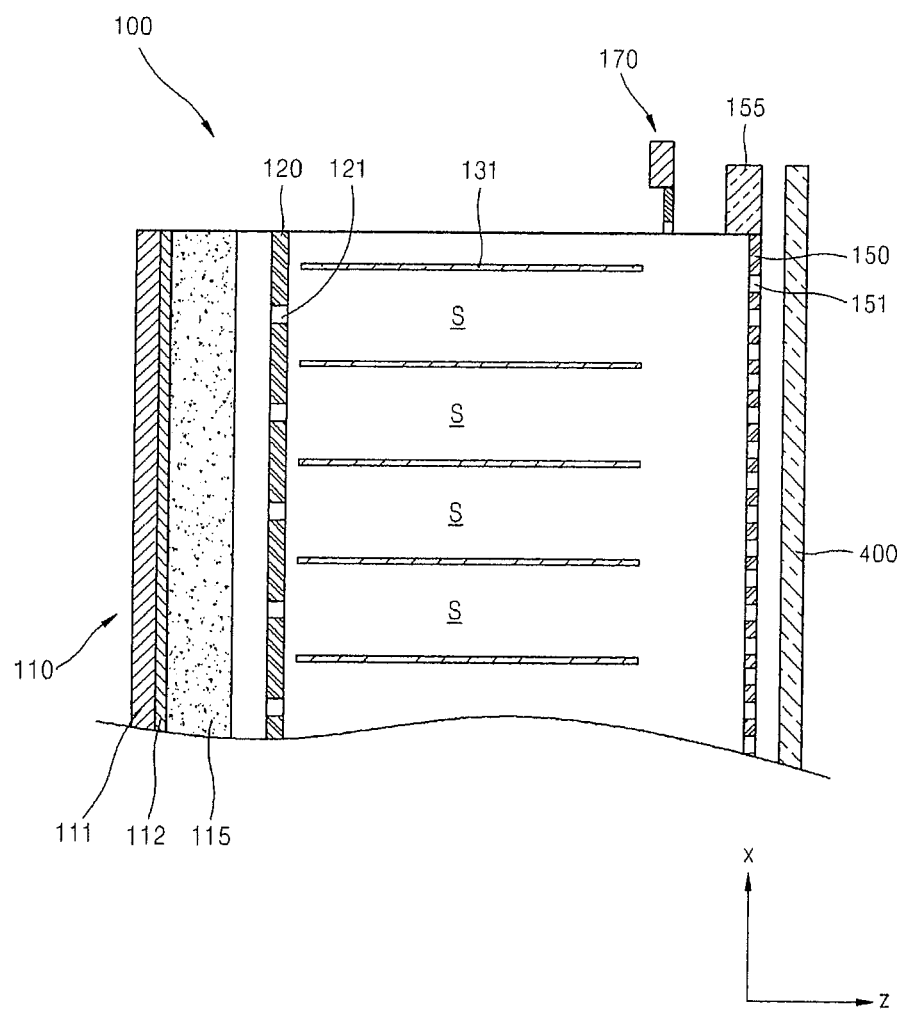
FIG. 3 is a schematic sectional plan view of the organic film deposition apparatus of FIG. 1.

FIG. 1 is a schematic perspective view of an organic film deposition apparatus 100 according to an embodiment of the present invention, FIG. 2 is a schematic cross-sectional side view of the organic film deposition apparatus 100 of FIG. 1, and FIG. 3 is a schematic cross-sectional plan view of the organic film deposition apparatus 100 of FIG. 1.

Referring to FIGS. 1 to 3, the organic film deposition apparatus 100 according to one embodiment of the present invention includes a deposition source 110, a deposition source nozzle unit 120, a barrier plate assembly 130, a patterning slit sheet 150, and first and second blocking members 160 and 170.

Although a chamber is not illustrated in FIGS. 1 through 3 for the convenience of explanation, all the components of the organic film deposition apparatus 100 may be located within a chamber that is maintained at an appropriate degree of vacuum. The chamber is maintained at an appropriate vacuum in order to allow a deposition material to move substantially in a straight line in the organic film deposition apparatus 100.

In such a chamber, a substrate 400, which is a deposition target on which a deposition material 115 is to be deposited, may be transferred by an electrostatic chuck (not shown). The substrate 400 may be a substrate for flat panel displays. A large substrate, such as a mother glass, for manufacturing a plurality of flat panel displays, may be used as the substrate 400. Other substrates may also be employed.

In an embodiment, the substrate 400 and/or the organic film deposition apparatus 100 may be moved relative to the other. For example, as illustrated in FIG. 1, the substrate 400 may be moved in a direction of an arrow A, relative to the organic film deposition apparatus 100.

In a conventional deposition method using a fine metal mask (FMM), the size of the FMM is typically greater than or equal to the size of a substrate. Thus, the size of the FMM has to be increased when performing deposition on a larger substrate. However, it is difficult to manufacture a large FMM and to extend an FMM to be accurately aligned with a pattern.

In order to overcome this problem, in the organic film deposition apparatus 100 according to one embodiment of the present invention, deposition may be performed while the organic film deposition apparatus 100 or the substrate 400 is moved relative to the other. That is, deposition may be continuously performed while the substrate 400, which is disposed so as to face the organic film deposition apparatus 100, is moved in a Y-axis direction. In other words, deposition is performed in a scanning manner while the substrate 400 is moved in a direction of arrow A in FIG. 1. Although the substrate 400 is illustrated as being moved in the Y-axis direction in FIG. 1 while deposition is performed, aspects of the present invention are not limited thereto. For example, deposition may be performed while the organic film deposition apparatus 100 is moved in the Y-axis direction, while the substrate 400 is held in a fixed position. In other embodiments, both the substrate 400 and the organic film deposition apparatus 100 may be moved in opposite directions with respect to each other along the Y-Axis.

Thus, in the organic film deposition apparatus 100 according to one embodiment of the present invention, the patterning slit sheet 150 may be significantly smaller than an FMM used in a conventional deposition method. In other words, in the organic film deposition apparatus 100, deposition is continuously performed, e.g., in a scanning manner, while the substrate 400 is moved in the Y-axis direction. Thus, a length of the patterning slit sheet 150 in the Y-axis direction may be significantly less than a length of the substrate 400 while a width of the patterning slit sheet 150 in the X-axis direction and a width of the substrate 400 in the X-axis direction are substantially equal to each other. However, even when the width of the patterning slit sheet 150 in the X-axis direction is less than the width of the substrate 400 in the X-axis direction, deposition may be performed on the entire substrate 400 in a scanning manner while the substrate 400 or the organic film deposition apparatus 100 is moved relative to the other.

As described above, since the patterning slit sheet 150 may be formed to be significantly smaller than an FMM used in a conventional deposition method, it is relatively easy to manufacture the patterning slit sheet 150 used in embodiments of the present invention. Further, using the patterning slit sheet 150, which is smaller than an FMM used in a conventional deposition method, is more convenient in all processes, including etching and other subsequent processes, such as precise extension, welding, moving, and cleaning processes, compared to the conventional deposition method using a larger FMM. This is more advantageous for manufacturing a relatively large display device.

In order to perform deposition while the organic film deposition apparatus 100 and/or the substrate 400 is moved relative to the other as described above, the organic film deposition apparatus 100 and the substrate 400 may be separated from each other (e.g., by a predetermined distance), as will be described later in detail.

The deposition source 110 that contains and heats the deposition material 115 is located at an opposite side of the chamber to a side at which the substrate 400 is located.

The deposition source 110 includes a crucible 112 that is filled with the deposition material 115, and a cooling block 111 surrounding the crucible 112. The cooling block 111 prevents radiation of heat from the crucible 112 outside, i.e., into the chamber. The cooling block 111 may include a heater (not shown) that heats the crucible 112.

The deposition source nozzle unit 120 is located at a side of the deposition source 110, and in particular, at the side of the deposition source 110 facing the substrate 400. The deposition source nozzle unit 120 includes a plurality of deposition source nozzles 121 (or deposition source nozzle slits) arranged at equal intervals (e.g., regular intervals) in the X-axis direction. The deposition material 115 that is vaporized in the deposition source 110 passes through the deposition source nozzles 121 of the deposition source nozzle unit 120 towards the substrate 400, which is a deposition target on which the deposition material 115 is to be deposited.

The barrier plate assembly 130 is located at a side of the deposition source nozzle unit 120. The barrier plate assembly 130 includes a plurality of barrier plates 131, and a barrier plate frame 132 that covers sides of the barrier plates 131. The plurality of barrier plates 131 may be arranged parallel to each other at equal intervals (e.g., regular intervals) in the X-axis direction. In addition, each of the barrier plates 131 may be arranged parallel to an YZ plane in FIG. 1, and may have a rectangular shape. The plurality of barrier plates 131 arranged as described above partitions the space between the deposition source nozzle unit 120 and the patterning slit sheet 150 into a plurality of sub-deposition spaces S (see FIG. 3). In the organic film deposition apparatus 100 according to one embodiment of the present invention, as illustrated in FIG. 3, the deposition space is divided by the barrier plates 131 into the sub-deposition spaces S that respectively correspond to the deposition source nozzles 121 through which the deposition material 115 is discharged.

The barrier plates 131 may be respectively located between adjacent deposition source nozzles 121. In other words, each of the deposition source nozzles 121 may be located between two adjacent barrier plates 131. The deposition source nozzles 121 may be respectively located at the midpoint between two adjacent barrier plates 131. However, the present invention is not limited to this structure. For example, two or more of the plurality of deposition source nozzles 121 may be located between two adjacent barrier plates 131. In this case, the two or more deposition source nozzles 121 between two adjacent barrier plates 131 may be also respectively located at the midpoint between the two adjacent barrier plates 131.

As described above, since the barrier plates 131 partition the space between the deposition source nozzle unit 120 and the patterning slit sheet 150 into the plurality of sub-deposition spaces S, the deposition material 115 discharged through each of the deposition source nozzles 121 is not mixed with the deposition material 115 discharged through the other deposition source nozzles 121, and passes through the patterning slits 151 so as to be deposited on the substrate 400. In other words, the barrier plates 131 guide the deposition material 115, which is discharged through the deposition source nozzles 121, to move straight in the Z-axis direction, and not to flow in the X-axis direction.

As described above, the deposition material 115 is forced to move straight by the presence of the barrier plates 131, so that a smaller shadow zone may be formed on the substrate 400, compared to a case where no barrier plates are installed. Thus, the organic film deposition apparatus 100 and the substrate 400 can be separated from each other (e.g., by a predetermined distance), as will be described later in detail.

The patterning slit sheet 150 and a frame 155, which surrounds and binds the patterning slit sheet 150, are located between the deposition source 110 and the substrate 400. The frame 155 may be formed in a lattice shape, similar to a window frame. The patterning slit sheet 150 includes a plurality of patterning slits 151 arranged in (e.g., located at equal or regular intervals along) the X-axis direction. Each of the patterning slits 151 extends in the Y-axis direction. The deposition material 115 that has been vaporized in the deposition source 110 and passed through the deposition source nozzle 121 passes through the patterning slits 151 towards the substrate 400.

The patterning slit sheet 150 may be formed of a metal thin film. The patterning slit sheet 150 is fixed to the frame 155 such that a tensile force is exerted thereon. For example, the patterning slit sheet 150 may be tightly stretched or pulled toward the frame 155 by exerting force in opposite directions along the X-axis and/or Y-axis directions. The patterning slits 151 may be formed by etching the patterning slit sheet 150 to have a stripe pattern. The number of patterning slits 151 may be equal to the number of deposition patterns to be formed on the substrate 400.

In addition, the barrier plate assembly 130 and the patterning slit sheet 150 may be located to be separated (e.g., spaced) from each other (e.g., by a predetermined distance). Alternatively, the barrier plate assembly 130 and the patterning slit sheet 150 may be coupled (e.g., connected) to each other by a connection member 135.

The first and second blocking members 160 and 170 are located between the barrier plate assembly 130 and the patterning slit sheet 150. In the organic film deposition apparatus 100 according to one embodiment of the present invention, the first blocking member 160 is movable together with the substrate 400 and is disposed (or arranged) to screen a first non-deposition region 401 and/or a second non-deposition region 402 of the substrate 400. The second blocking member 170 having an open mask structure (e.g., frame shaped) is held in a fixed position. The first and second blocking members 160 and 170 prevent the deposition material 115 from being deposited on first and second non-deposition regions 401 and 402 of the substrate 400. This will be described later in detail with reference to FIG. 4.

As described above, the organic film deposition apparatus 100 according to one embodiment of the present invention performs deposition while being moved relative to the substrate 400. In order for the organic film deposition apparatus 100 to be movable relative to the substrate 400, the patterning slit sheet 150 may be spaced apart from the substrate 400 (e.g., by a predetermined distance). In addition, in order to prevent the formation of a relatively large shadow zone on the substrate 400 when the patterning slit sheet 150 and the substrate 400 are spaced apart from each other, the barrier plates 131 are arranged between the deposition source nozzle unit 120 and the patterning slit sheet 150 to force the deposition material 115 to move in a straight direction. Thus, the size of the shadow zone that may be formed on the substrate 400 may be reduced (e.g., sharply reduced).

In a conventional deposition method using an FMM, deposition is performed with the FMM in close contact with a substrate in order to prevent formation of a shadow zone on the substrate. However, when the FMM is used in close contact with the substrate, the contact may cause defects, such as scratches on patterns formed on the substrate. In addition, in the conventional deposition method, the size of the mask has to be the same as the size of the substrate since the mask cannot be moved relative to the substrate. Thus, the size of the mask has to be increased as display devices become larger. However, it is not easy to manufacture such a large mask.

In order to overcome this and/or other problems, in the organic film deposition apparatus 100 according to one embodiment of the present invention, the patterning slit sheet 150 is located to be spaced apart from the substrate 400 (e.g., by a predetermined distance), which may be facilitated by installing the barrier plates 131 to reduce the size of the shadow zone formed on the substrate 400. Shadow zones on the substrate 400 may be reduced or minimized by installing the barrier plates 131.

Hereinafter, embodiments of a method of depositing an organic film by using the organic film deposition apparatus 100, including the first and second blocking members 160 and 170, according to embodiments of the present invention will be described in detail.

FIGS. 4 through 11 are cross-sectional views for illustrating a method of manufacturing an organic light emitting display device by using the organic film deposition apparatus 100 described above, according to an embodiment of the present invention.

Referring to FIGS. 4 to 11, the first and second blocking members 160 and 170 of the organic film deposition apparatus 100 are disposed (or arranged) to screen the first and second non-deposition regions 401 and 402 of the substrate 400 and prevent the deposition material 115 from being deposited on the first and second non-deposition regions 401 and 402, wherein the first blocking member 160 is movable along with the substrate 400, and the second blocking member 170 having an open mask structure is held in a fixed position.

For example, an anode pattern or a cathode pattern is formed at edge regions of the substrate 400, and may be used as a terminal for product testing or manufacturing. However, if an organic film is deposited on the edge regions (e.g., the first and second non-deposition regions 401 and 402) of the substrate 400, the anode or cathode may not function properly. Thus, it is desirable to avoid deposition of organic material on the first and second non-deposition regions 401 and 402 of the substrate 400. As described above, however, since deposition is performed in a scanning manner while the substrate 400 is moved relative to the organic film deposition apparatus 100, it is not easy to prevent the organic material from being deposited on the first and second non-deposition regions 401 and 402 of the substrate 400.

As such, in order to prevent or reduce deposition of the organic material on the first and second non-deposition regions 401 and 402 of the substrate 400, the organic film deposition apparatus 100 includes the first and second blocking members 160 and 170 disposed (or arranged) to screen the edge regions of the substrate 400.

Figure 4:
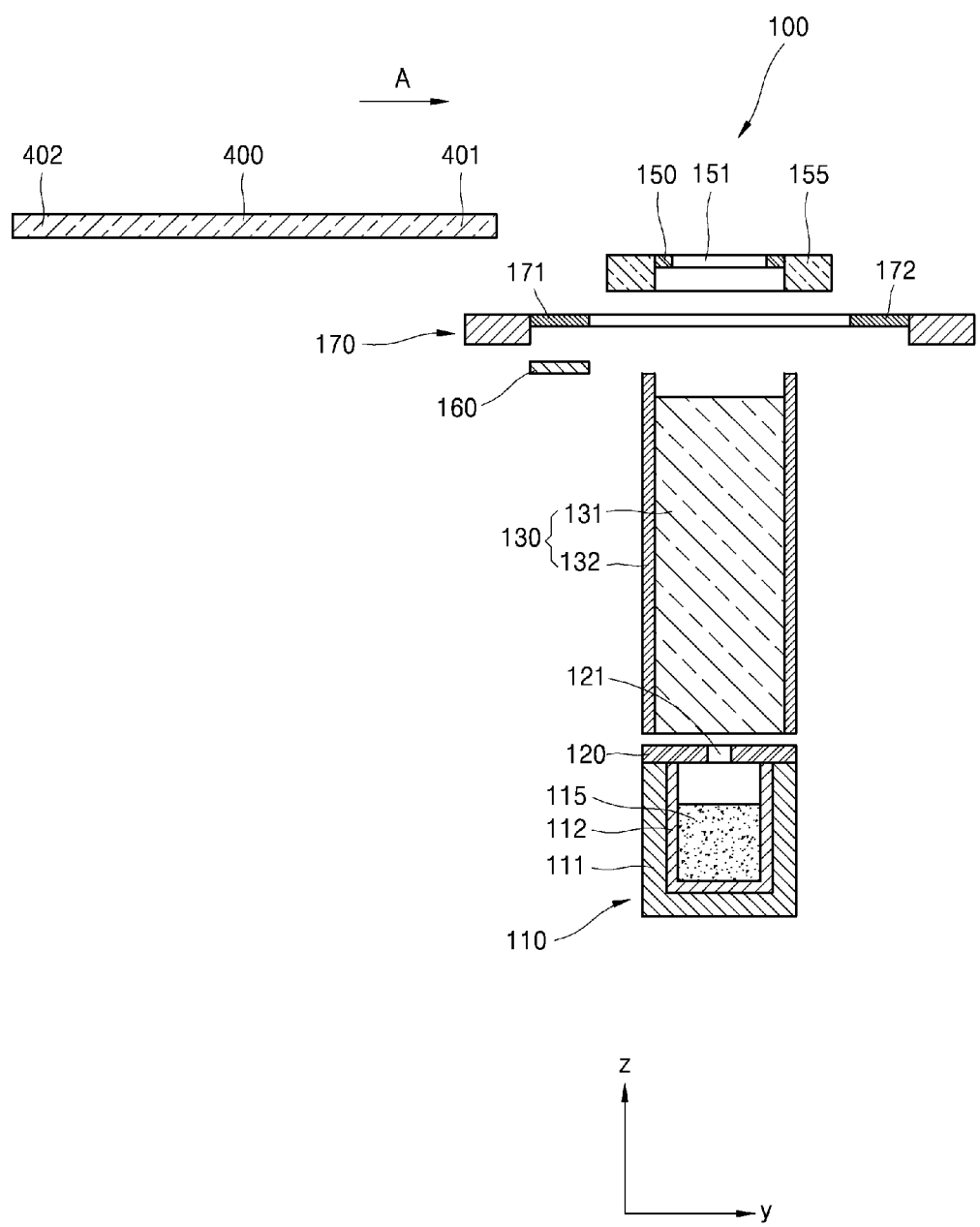
FIGS. 4 through 11 are cross-sectional views for illustrating a method of manufacturing an organic light emitting display device by using the organic film deposition apparatus of FIG. 1, according to an embodiment of the present invention.

Referring to FIG. 4, the first blocking member 160 is located to be spaced apart from the substrate 400, for example, spaced apart from a surface of the substrate 400 facing the deposition source 110. The second blocking member 170, which has an open mask shape, is located between the first blocking member 160 and the substrate 400, and is held in a fixed position relative to the moving substrate 400. The first blocking member 160 may have a flat planar shape, and the second blocking member 170 may have an open mask shape, like a window frame, for example.

As described above, deposition may be continuously performed while the substrate 400, which is located so as to face the organic film deposition apparatus 100, is moved in a Y-axis direction. In other words, deposition is performed in a scanning manner while the substrate 400 is moved in a direction of arrow A in FIG. 4. The first blocking member 160 is held in a fixed position overlapping with a first region 171 of the second blocking member 170 until the first non-deposition region 401 of the substrate 400 is moved over the first blocking member 160.

Figure 5:
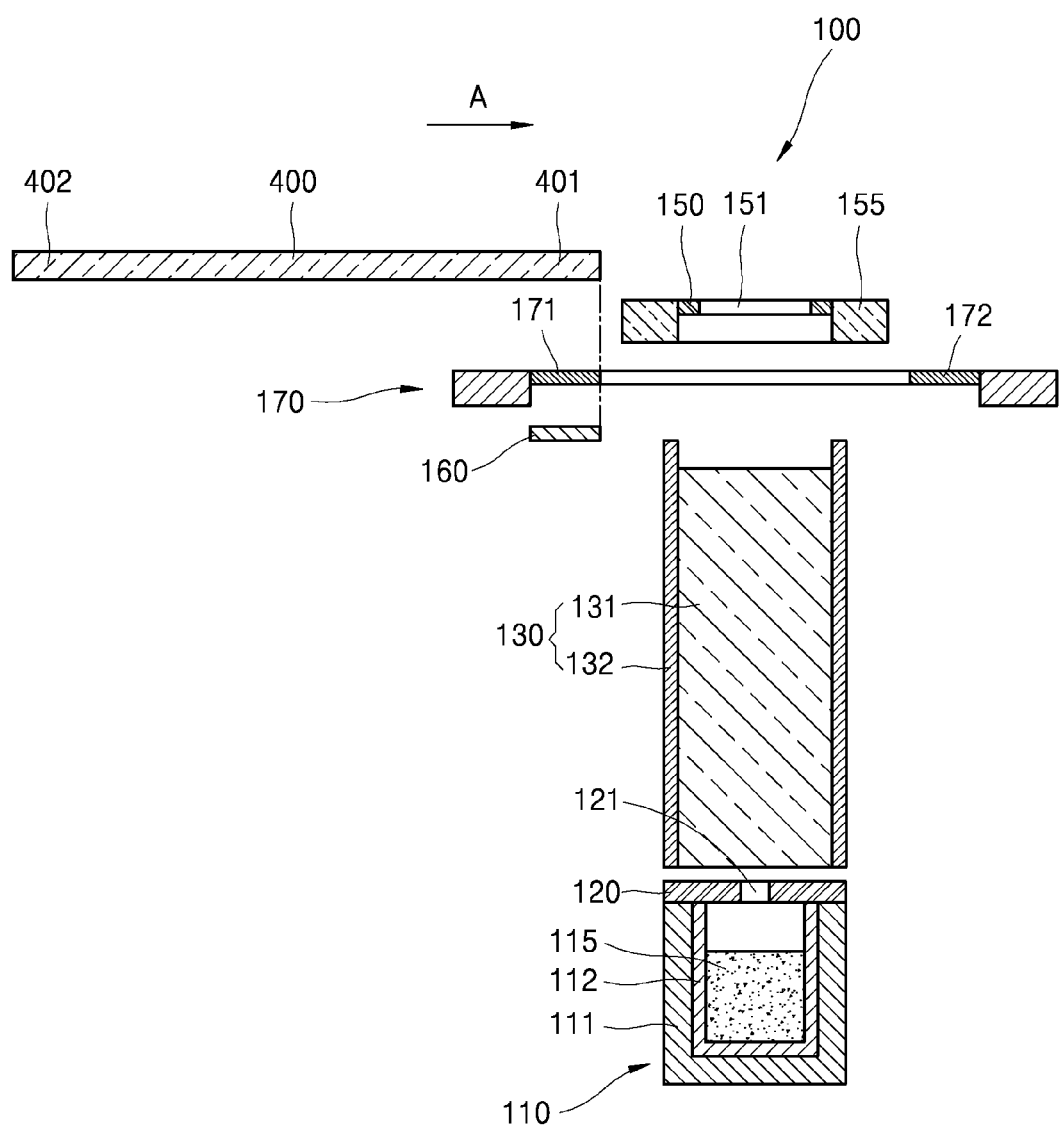
Figure 6:
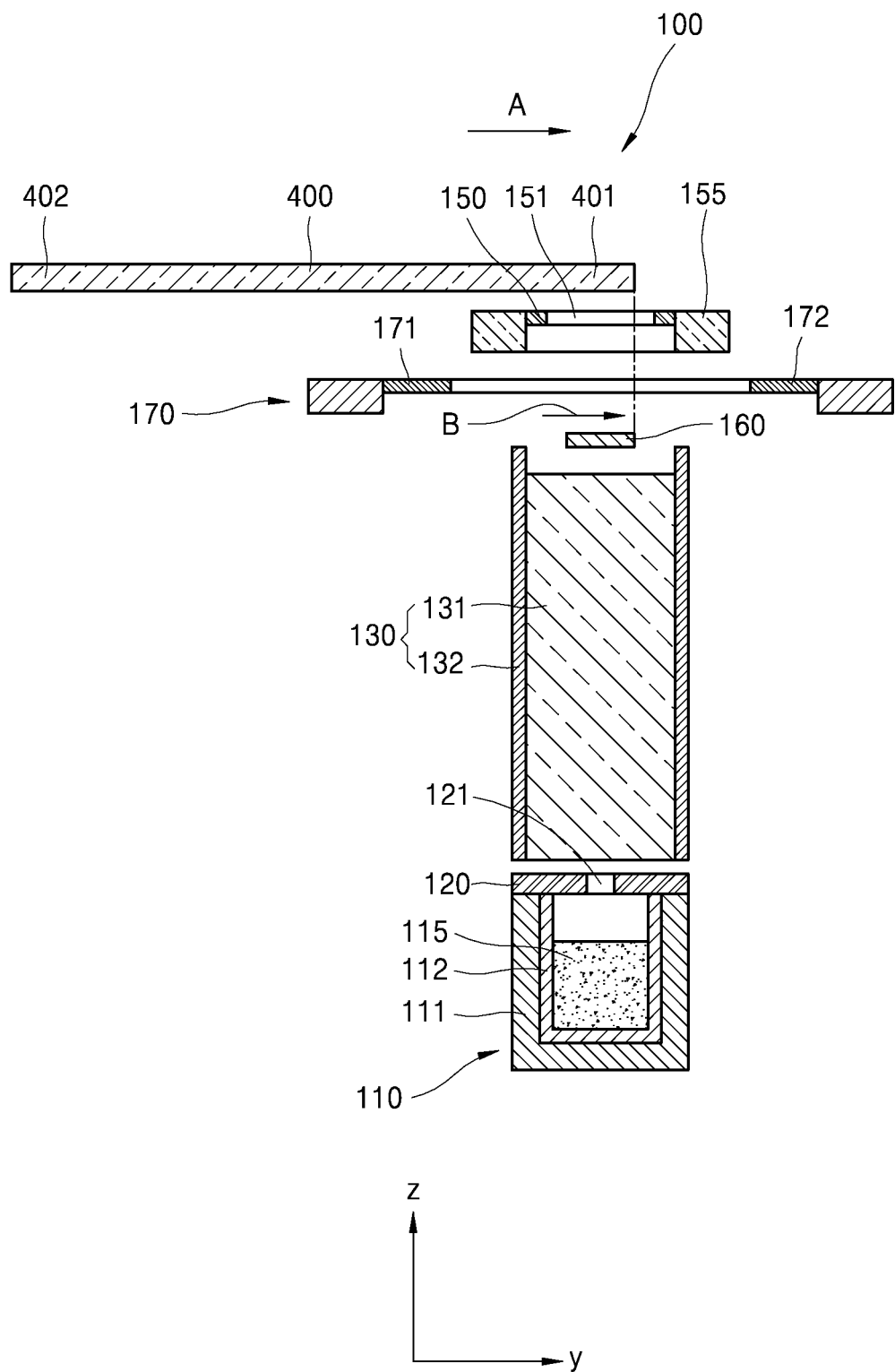

The first blocking member 160 starts moving along with the substrate 400 from a moment when the first non-deposition region 401 of the substrate 400 has reached and overlapped with the first blocking member 160, as illustrated in FIGS. 5 and 6.

The first blocking member 160 may be moved in a direction of arrow B (see FIG. 6) at the same speed as that of the substrate 400. Thus, the relative position of the first blocking member 160 with respect to the substrate 400 may remain the same or substantially the same. That is, the first blocking member 160 may remain in a blocking position relative to the first non-deposition region 401 of the substrate 400.

When the substrate 400 has moved in the direction of arrow A and the first non-deposition region 401 of the substrate 400 has been positioned to face the deposition source 110, the first blocking member 160 is located between the barrier plate assembly 130 and the patterning slit sheet 150, blocking the deposition material 115 that is vaporized from the deposition source 110 from being deposited on the first non-deposition region 401 of the substrate 400.

Figure 7:
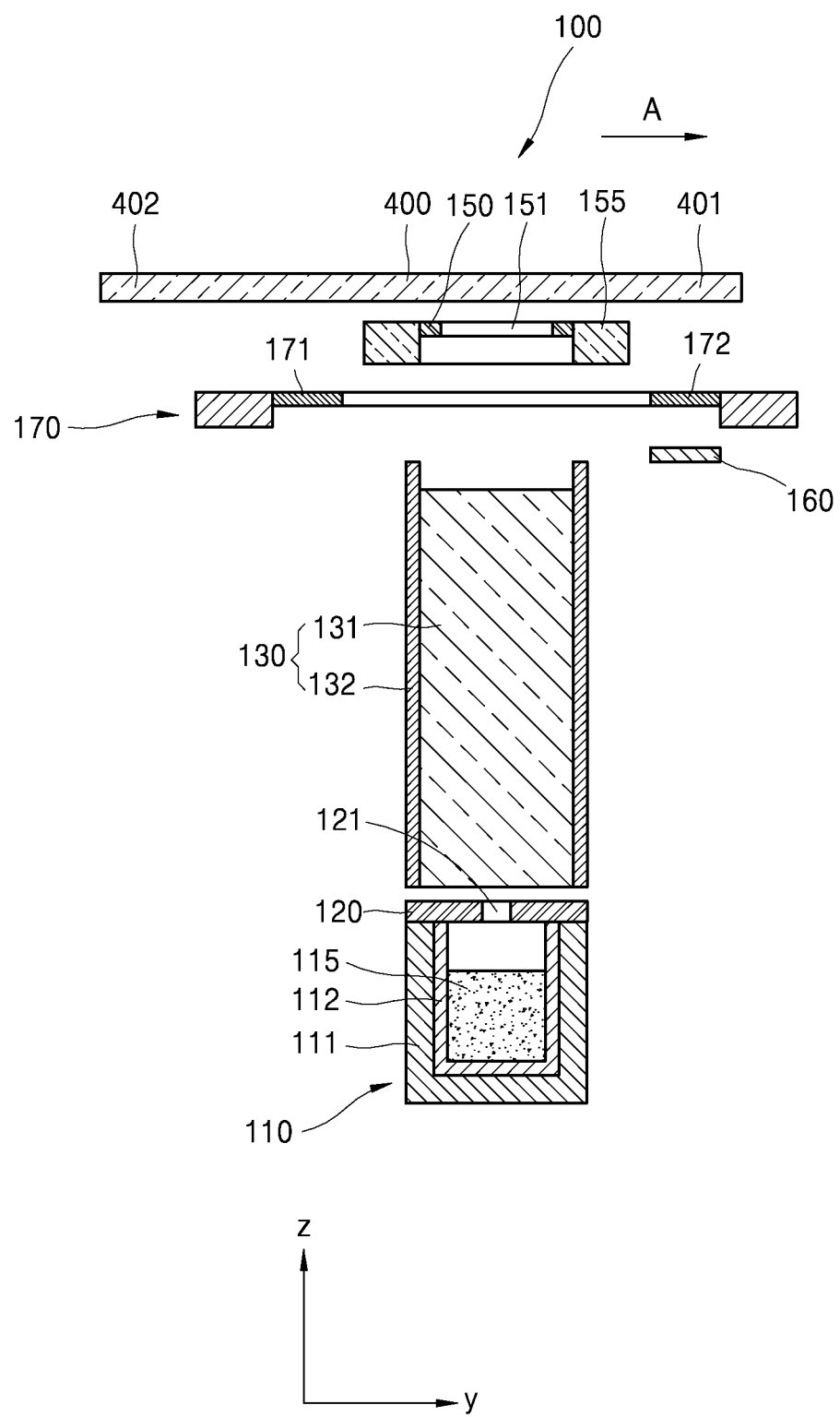

Then, as illustrated in FIG. 7, when the first non-deposition region 401 of the substrate 400 and the first blocking member 160 have passed a deposition zone where deposition takes place and reached a position overlapping with a second region 172 of the second blocking member 170, the first blocking member 160 stops moving and stays in that position, while the substrate 400 continues moving in the direction of arrow A at the same speed.

Figure 8:
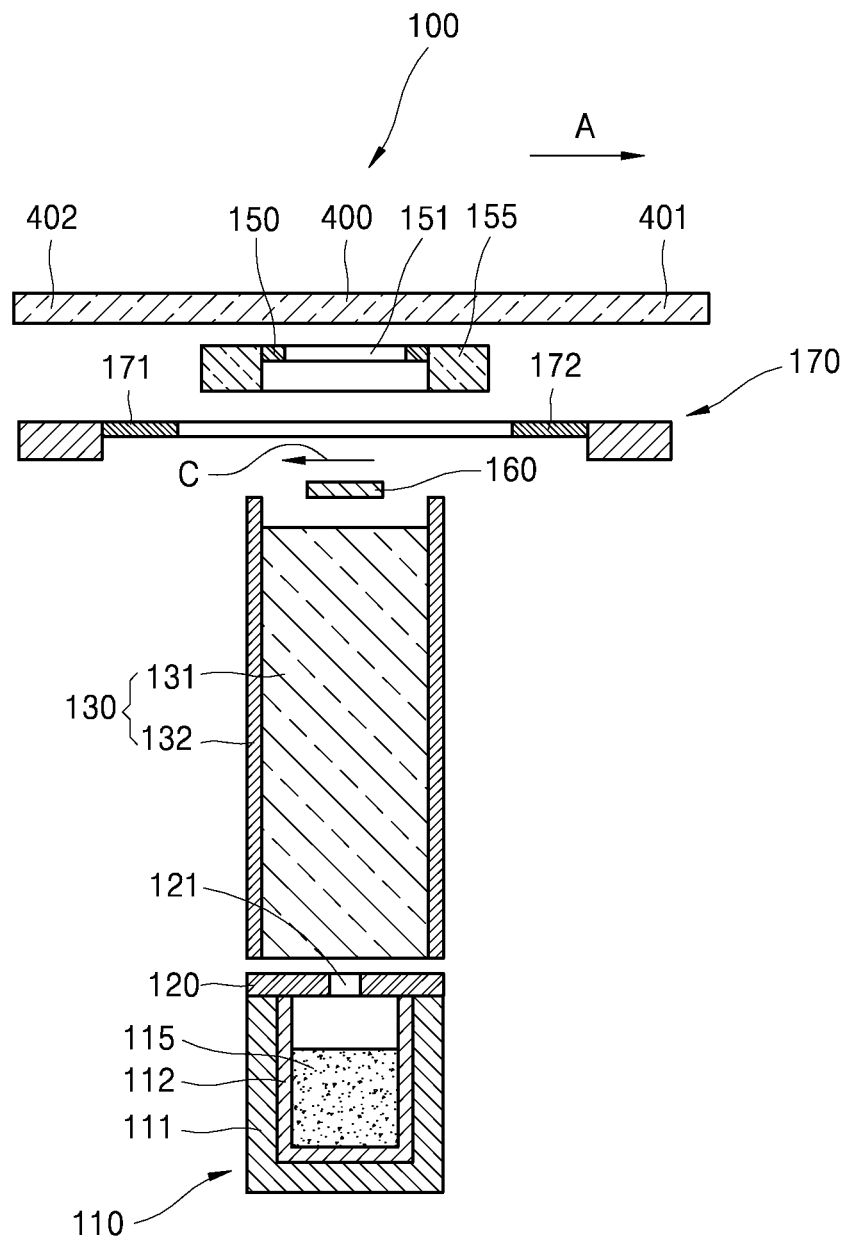

Then, as illustrated in FIG. 8, the first blocking member 160 is moved in a direction of arrow C back to the initial position to block the deposition material 115 from being deposited on the second non-deposition region 402 of the substrate 400. At this stage the first blocking member 160 is moved at a higher speed than the substrate 400 to be able to timely reach the first region 171 of the second blocking member 170.

If the second blocking member 170 is not present, a thickness of an organic film deposited on the substrate 400 while the first blocking member 160 is positioned as illustrated in FIG. 7 may differ from a thickness of an organic film deposited on the substrate 400 while the first blocking member 160 is moved in the direction of arrow C as illustrated in FIG. 8. This may reduce thickness uniformity of the organic film deposited on the substrate 400.

For example, while being in the position illustrated in FIG. 7, the first blocking member 160 may effectively block the deposition material 115 vaporized from the deposition source 110 so as not to be deposited on a region of the substrate 400 that has passed the deposition zone where the deposition source 110 is placed. On the other hand, while the first blocking member 160 is being moved in the direction of arrow C as illustrated in FIG. 8, the deposition material 115 vaporized from the deposition source 110 may still be deposited on the region of the substrate 400 that has passed the deposition zone where the deposition source 110 is placed, unnecessarily increasing the thickness of the organic film deposited on that region of the substrate 400. That is, the thickness of the organic film deposited on the substrate 400 may vary according to positions of the first blocking member 160.

To address this drawback, the organic film deposition apparatus 100 according to an aspect of the present invention further includes the second blocking member 170 having an open mask shape, which is held in a fixed position, in addition to the first blocking member 160 that is movable along with the substrate 400. The second blocking member 170 ensures the organic film deposited on the substrate 400 to have a constant thickness (or a substantially constant thickness) irrespective of the position of the first blocking member 160. The second blocking member 170 effectively blocks the deposition material 115 vaporized from the deposition source 110 from being deposited on the region of the substrate 400 that has passed through the deposition zone where the deposition source 110 is placed, irrespective of the position of the first blocking member 160.

The second blocking member 170 may include at least one material selected from the group consisting of carbon (C), iron (Fe), chrome (Cr), manganese (Mn), nickel (Ni), titanium (Ti), molybdenum (Mo), stainless steel (SUS), an Invar alloy, an Inconel alloy, a Kovar alloy, and combinations thereof. However, any suitable material may be used for the second blocking material 170. In some embodiments, the second blocking member 170 may include an Invar alloy, which undergoes less thermal expansion and is less crushed than stainless steel (SUS). Invar alloys may almost constantly maintain tension even at high temperatures, and are unlikely to interfere with the first blocking member 160.

As described above, according to aspects of one embodiment of the present invention, the organic film deposited on the substrate 400 may have a more uniform thickness.

Figure 9:
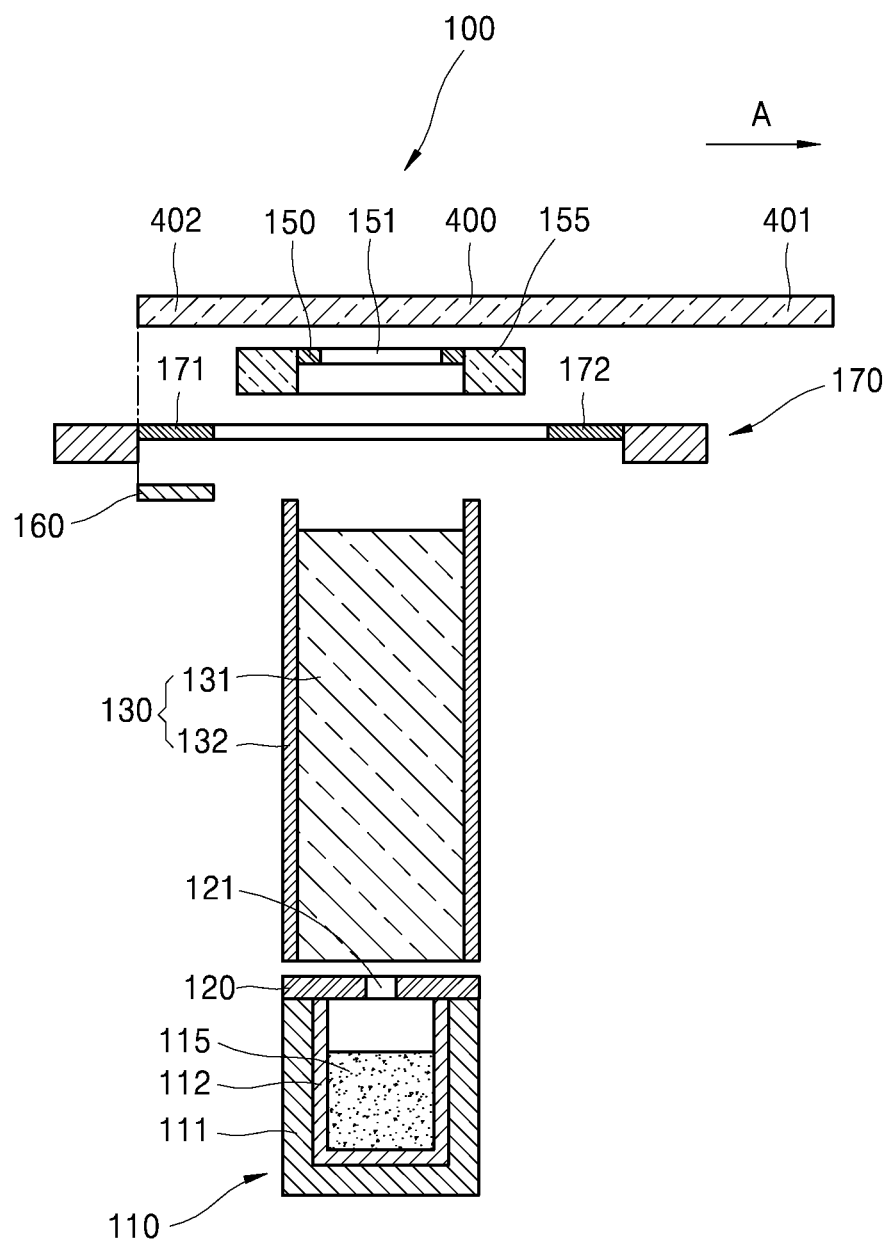
Figure 10:
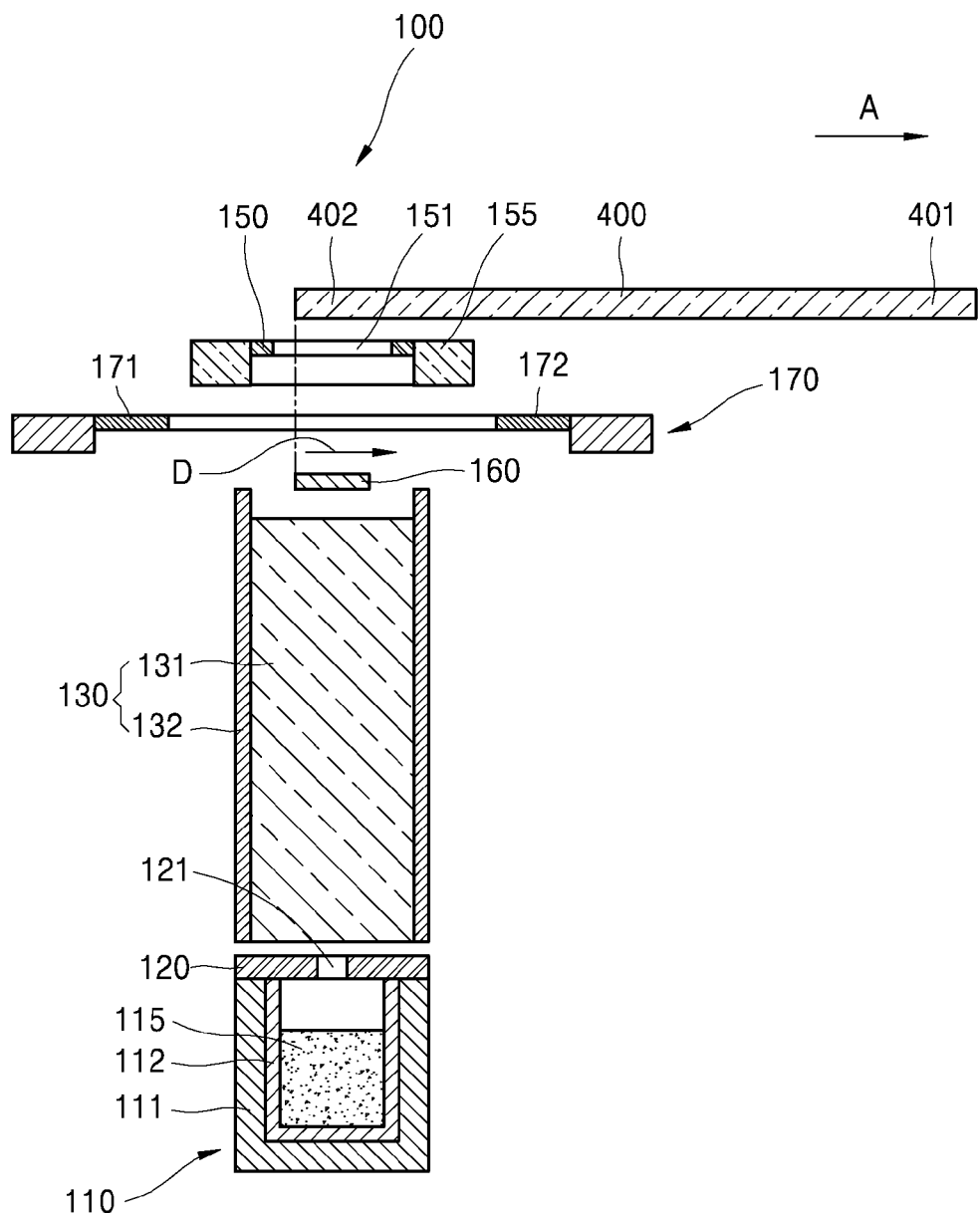

Next, as illustrated in FIGS. 9 and 10, while the first blocking member 160 is in the position overlapping with the first region 171 of the second blocking member 170, once the substrate 400 has moved for the second non-deposition region 402 of the substrate 400 to reach above and overlap with the first blocking member 160, the first blocking member 160 starts moving along with the substrate 400.

The first blocking member 160 may be moved in a direction of arrow D (e.g., see FIG. 10) at the same speed as that of the substrate 400. Thus, the relative position of the first blocking member 160 with respect to the substrate 400 may remain the same or substantially the same. That is, the first blocking member 160 may remain in a blocking position relative to the second non-deposition region 402 of the substrate 400.

When the substrate 400 has moved in the direction of arrow A and the second non-deposition region 402 of the substrate 400 has been positioned to face the deposition source 110, the first blocking member 160 is located between the barrier plate assembly 130 and the patterning slit sheet 150, blocking the deposition material 115 vaporizing from the deposition source 110 from being deposited on the second non-deposition region 402 of the substrate 400.

Figure 11:
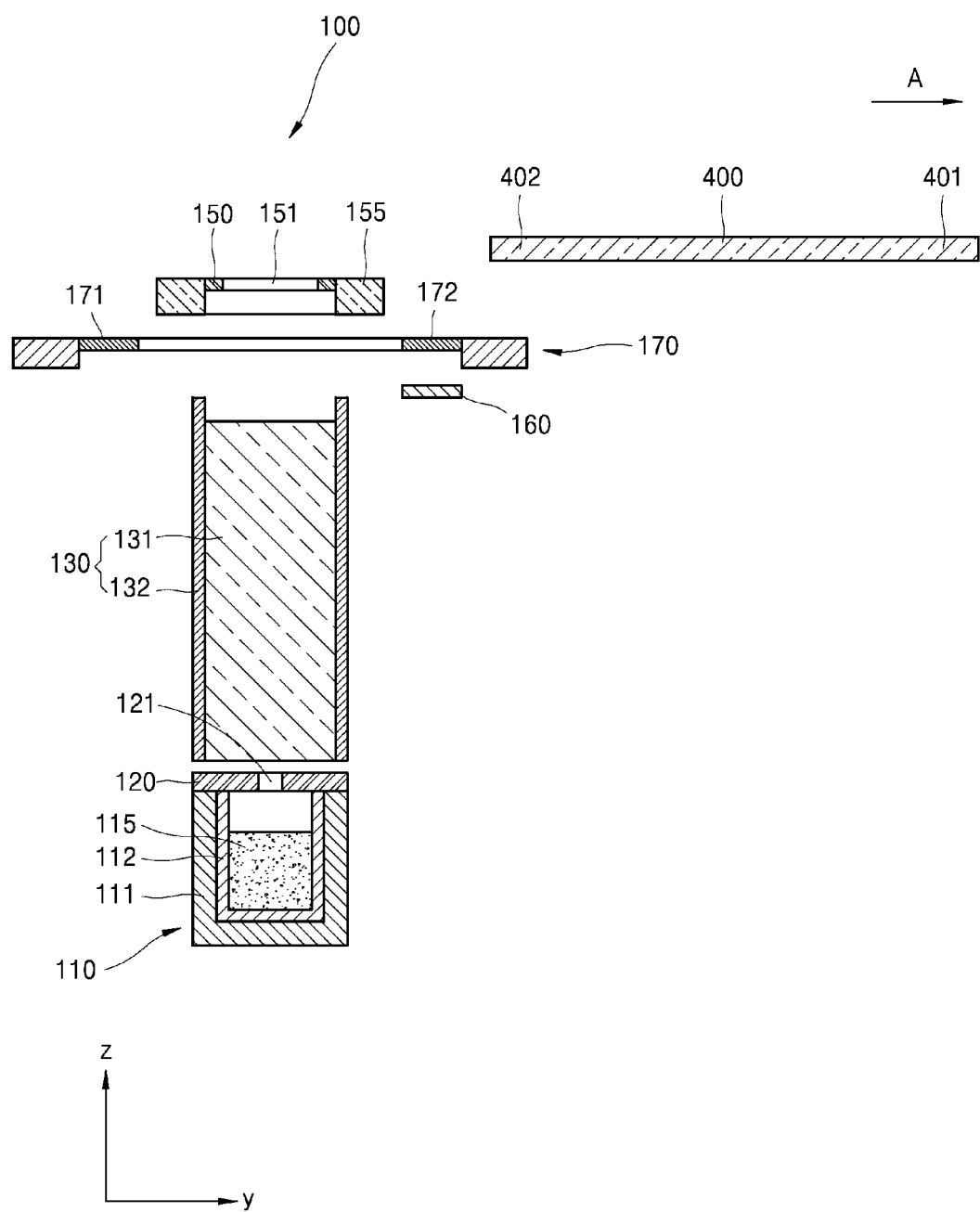

Then, as illustrated in FIG. 11, when the second non-deposition region 402 of the substrate 400 and the first blocking member 160 have passed the deposition zone where deposition takes place and reached a position overlapping with the second region 172 of the second blocking member 170, the first blocking member 160 stops moving and stays in that position, while the substrate 400 continues moving in the direction of arrow A at the same speed.

As described above, according to aspects of one embodiment of the present invention, the organic film deposited on the substrate 400 may have a more uniform thickness.

Figure 12:
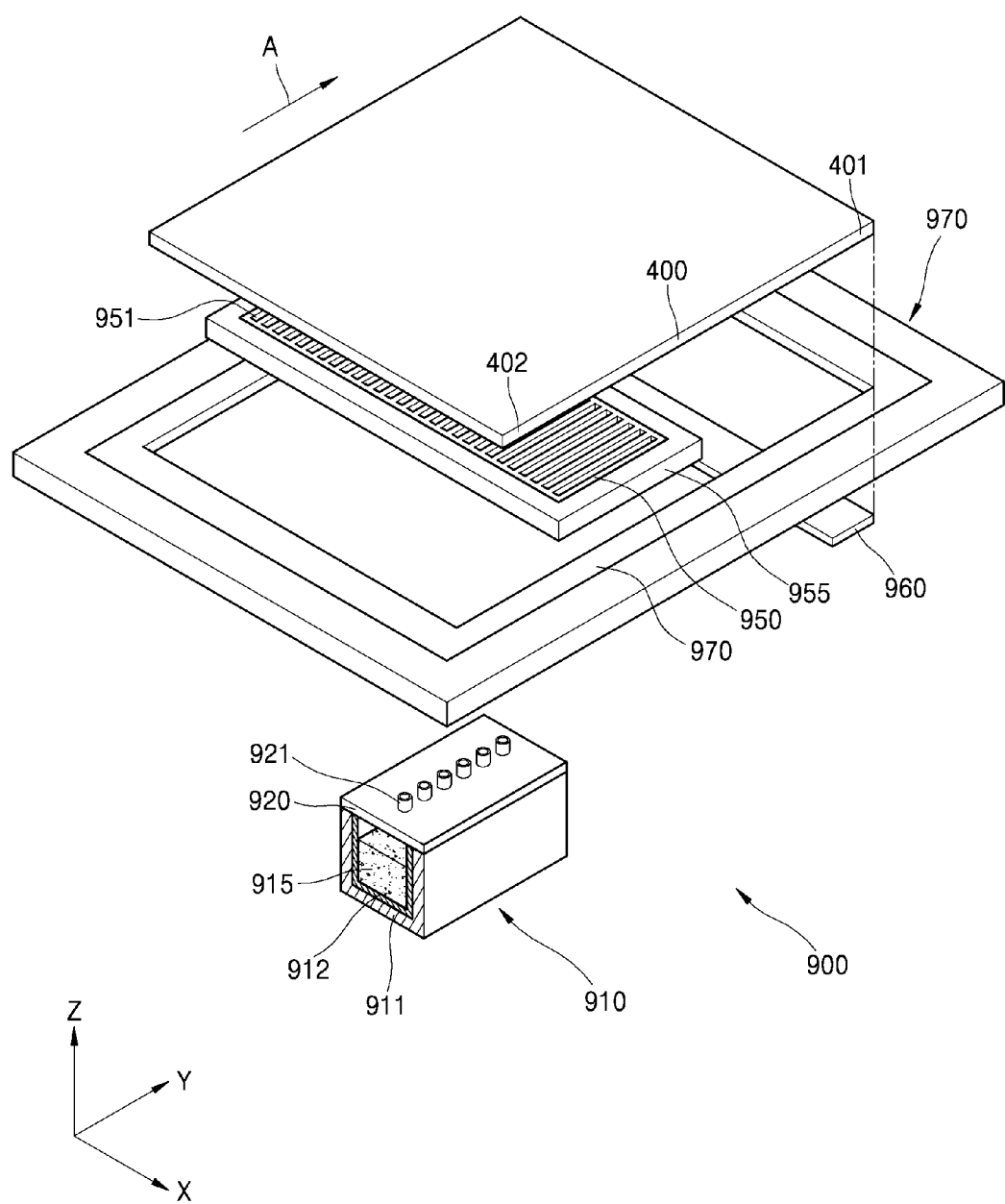
FIG. 12 is a schematic perspective view of an organic film deposition apparatus according to another embodiment of the present invention.

FIG. 12 is a schematic perspective view of an organic film deposition apparatus 900 according to another embodiment of the present invention.

Referring to FIG. 12, an organic film deposition apparatus 900 according to one embodiment includes a deposition source 910, a deposition source nozzle unit 920, a patterning slit sheet 950, a first blocking member 960, and a second blocking member 970.

For example, the deposition source 910 includes a crucible 912 that is filled with a deposition material 915, and a heater 911 that heats the crucible 912 to vaporize the deposition material 915, which is contained in the crucible 912, so as to move the vaporized deposition material 915 toward the deposition source nozzle unit 920. The deposition source nozzle unit 920, which has a planar shape, is located at a side of the deposition source 910. The deposition source nozzle unit 920 includes a plurality of deposition source nozzles 921 arranged in the Y-axis direction (e.g., located at equal or regular intervals along the Y-axis direction). The patterning slit sheet 950 and a frame 955 are further located between the deposition source 910 and the substrate 400. The patterning slit sheet 950 includes a plurality of patterning slits 951 arranged in the X-axis direction (e.g., located at equal or regular intervals along the X-axis direction) that is perpendicular to the Y-axis direction. In addition, the deposition source 910 and the deposition source nozzle unit 920 may be coupled or connected to the patterning slit sheet 950 by a connection member 935.

The organic film deposition apparatus 900 illustrated in FIG. 12 differs from the organic film deposition apparatus 100 illustrated in FIG. 1 in terms of the arrangement of the plurality of deposition source nozzles in the deposition source nozzle unit 920, which will now be described in detail.

The deposition source nozzle unit 920 is located at a side of the deposition source 910, and in particular, at the side of the deposition source 910 facing the substrate 400. The deposition source nozzle unit 920 includes a plurality of deposition source nozzles 921 arranged at equal intervals (e.g., regular intervals) in the Y-axis direction, i.e., a scanning direction of the substrate 400. The deposition material 915 that is vaporized in the deposition source 910, passes through the deposition source nozzle unit 920 towards the substrate 400. As described above, when the deposition source nozzle unit 920 includes the plurality of deposition source nozzles 921 arranged in the Y-axis direction, that is, in the scanning direction of the substrate 400, the size of a pattern formed of the deposition material discharged through the patterning slits 951 of the patterning slit sheet 950 depends on the size of one of the deposition source nozzles 921 (since there is only one line of deposition nozzles in the X-axis direction), and thus no shadow zone may be formed on the substrate 500. In addition, since the plurality of deposition source nozzles 921 are arranged in the scanning direction of the substrate 400, even when there is a difference in flux between the deposition source nozzles 921, the difference may be compensated for and deposition uniformity may be maintained constantly or substantially constantly.

In the organic film deposition apparatus 900 according to one embodiment of the present invention, the first blocking member 960 is movable along with the substrate 400 and is disposed (or arranged) to screen either the first non-deposition region 401 and/or the second non-deposition region 402 of the substrate 400. The second blocking member 970 having an open mask structure is held in a fixed position. The first and second blocking members 960 and 970 prevent the deposition material 915 from being deposited on first and second non-deposition regions 401 and 402 of the substrate 400, and at the same time, improve thickness uniformity of an organic film deposited on the substrate 400. This structure is described in the embodiment with reference to FIG. 4, and thus a detailed description thereof will not be repeated here.

As described above, with a thin film deposition apparatus according to embodiments of the present invention and a method of manufacturing an organic light-emitting display device according to embodiments of the present invention by using the thin film deposition apparatus, large-sized display devices may be manufactured on a mass scale in a simple fashion. In addition, the thin film deposition apparatus and the organic-light-emitting display device may be easily manufactured, may improve manufacturing yield and deposition efficiency, and may allow deposition materials to be reused.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing an organic light-emitting display device by using an organic film deposition apparatus for forming an organic film on a substrate, the method comprising:
   arranging the substrate to be spaced apart from the organic film deposition apparatus; and
   depositing a deposition material discharged from the organic film deposition apparatus on the substrate while moving the substrate relative to the organic film deposition apparatus,
   wherein the depositing of the deposition material on the substrate further comprises:
   placing a second blocking member in a fixed position;
   moving a first blocking member together with a first non-deposition region of the substrate while the deposition material is deposited on the substrate;
   moving the first blocking member back to an original position; and
   moving the first blocking member together with a second non-deposition region of the substrate while the deposition material is deposited on the substrate, and
   wherein in the moving of the first blocking member back to the original position, the first blocking member is moved at a higher speed than the substrate.

2. A method of manufacturing an organic light-emitting display device by using an organic film deposition apparatus for forming an organic film on a substrate, the method comprising:
   arranging the substrate to be spaced apart from the organic film deposition apparatus; and
   depositing a deposition material discharged from a deposition source nozzle unit of the organic film deposition apparatus on the substrate while moving the substrate relative to the organic film deposition apparatus,
   wherein the depositing of the deposition material on the substrate comprises:
   placing a second blocking member in a fixed position with respect to the organic film deposition apparatus, and such that the second blocking member blocks the deposition material that is discharged from the deposition source nozzle unit from reaching a region of the substrate;
   moving a first blocking member together with a first non-deposition region of the substrate while the deposition material is deposited on the substrate;
   moving the first blocking member back to an original position to change a location of the first blocking member with respect to the substrate; and
   moving the first blocking member together with a second non-deposition region of the substrate while the deposition material is deposited on the substrate;
   wherein depositing the deposition material on the substrate further comprises discharging the deposition material from the deposition source nozzle unit through a patterning slit sheet, wherein the deposition source nozzle unit comprises a plurality of deposition source nozzles arranged in a first direction located at a side of the deposition source, wherein the patterning slit sheet comprises a plurality of patterning slits arranged in a second direction perpendicular to the first direction and is located opposite to the deposition source nozzle unit, wherein the first blocking member is located between the substrate and the deposition source, and wherein the fixed position of the second blocking member is between the first blocking member and the substrate.

3. The method of claim 2, wherein the patterning slit sheet is smaller than the substrate.

* * * * *